(12) United States Patent
Park

(10) Patent No.: US 9,543,309 B2
(45) Date of Patent: Jan. 10, 2017

(54) ANTIFUSE MEMORY CELLS AND ARRAYS THEREOF

(71) Applicant: SK hynix Inc., Gyeonggi-do (KR)

(72) Inventor: Sung Kun Park, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/823,783

(22) Filed: Aug. 11, 2015

(65) Prior Publication Data

US 2016/0293612 A1 Oct. 6, 2016

(30) Foreign Application Priority Data

Apr. 6, 2015 (KR) .................. 10-2015-0048676

(51) Int. Cl.
*H01L 29/04* (2006.01)
*H01L 29/66* (2006.01)
*H01L 21/02* (2006.01)
*H01L 27/112* (2006.01)

(52) U.S. Cl.
CPC .............................. *H01L 27/11206* (2013.01)

(58) Field of Classification Search
CPC .................... H01L 27/11206; H01L 27/11226; H01L 29/861; H01L 29/4983

USPC .... 257/50, 173, 408, E21.59, 335, 530, 213, 257/355, 369, E21.66; 438/130, 140, 257, 438/128, 142, 151, 267

See application file for complete search history.

(56) References Cited

U.S. PATENT DOCUMENTS

| | | | | |
|---|---|---|---|---|
| 4,745,079 A | * | 5/1988 | Pfiester | H01L 21/28105 148/DIG. 82 |
| 5,554,552 A | * | 9/1996 | Chi | H01L 21/8221 257/315 |
| 8,748,235 B2 | | 6/2014 | Mitchell et al. | |
| 2006/0001050 A1 | * | 1/2006 | Wang | H01L 29/4916 257/213 |
| 2008/0048266 A1 | * | 2/2008 | Russ | H01L 27/0274 257/355 |
| 2009/0032889 A1 | * | 2/2009 | Zhu | H01L 21/28105 257/410 |
| 2010/0110750 A1 | * | 5/2010 | Namekawa | G11C 5/145 365/96 |
| 2013/0229857 A1 | * | 9/2013 | Kajigaya | G11C 8/12 365/149 |

* cited by examiner

*Primary Examiner* — Long K Tran
*Assistant Examiner* — Dzung Tran
(74) *Attorney, Agent, or Firm* — IP & T Group LLP

(57) ABSTRACT

An antifuse memory cell includes an antifuse element and a gate PN diode. The antifuse element includes a gate terminal coupled to a word line, a drain terminal coupled to a bit line, and a body terminal. The gate PN diode is coupled between the word line and the gate terminal.

5 Claims, 21 Drawing Sheets

ANTIFUSE MEMORY CELLS AND ARRAYS THEREOF

CROSS-REFERENCE TO RELATED APPLICATION

The present application claims priority under 35 U.S.C. 119(a) to Korean Application No. 10-2015-0048676, filed on Apr. 6, 2015, which is incorporated herein by reference in its entirety.

BACKGROUND

1. Technical Field

Various embodiments of the present disclosure relate to nonvolatile memory devices and, more particularly, to antifuse memory cells and arrays thereof.

2. Related Art

Nonvolatile memory devices retain their stored data even without a constant source of power. Examples of nonvolatile memory devices include read only memory (ROM) devices, one-time programmable (OTP) memory devices and rewritable memory devices. Nonvolatile memory devices have been produced using a complementary metal-oxide-semiconductor (CMOS) compatible process.

The OTP memory devices may be categorized as either fuse-type OTP memory devices or antifuse-type OTP memory devices. Each memory cell in the fuse type OTP memory devices begins as a short circuit (i.e. there is a current path) before it is programmed. And, when programmed, can remain a short or be changed to an open circuit, depending on how it is programmed. In contrast, each memory cell in an antifuse-type OTP memory device begins as an open circuit before it is programmed and, when programmed, is a short or open circuit depending on the data that it stores. Considering the characteristics of MOS transistors, the CMOS processes may be suitable for fabrication of antifuse-type OTP memory devices.

SUMMARY

Various embodiments are directed to antifuse mm cry cells and arrays thereof.

According to an embodiment, an antifuse memory cell includes an antifuse element including a gate terminal coupled to a word line, a drain terminal coupled to a bit line, and a body terminal, and a gate PN diode coupled between the word line and the gate terminal.

According to an embodiment, an antifuse memory cell includes an active region extending in a first direction, and having a channel region of a first conductivity type and an impurity junction region of a second conductivity type that is in contact with the channel region along the first direction, a gate electrode extending in a second direction to intersect the active region, and having a first gate electrode of the second conductivity type that overlaps with the channel region of the active region and a second gate electrode of the first conductivity type that is in contact with the first gate electrode along the second direction without overlapping the active region, and an insulation layer between the active region and the gate electrode.

According to an embodiment, an antifuse memory cell includes an active region extending in a first direction, and having a channel region of a first conductivity type and an impurity junction region of a second conductivity type that is in contact with the channel region along the first direction, a gate electrode extending in a second direction to intersect the active region, and having a first gate electrode of the second conductivity type that overlaps with the channel region of the active region and a second gate electrode of the first conductivity type stacked on the first gate electrode and in contact with the first gate electrode, and an insulation layer between the active region and the gate electrode.

According to an embodiment, there is provided an antifuse memory cell array including a plurality of word lines and a plurality of bit lines that intersect, and a plurality of antifuse memory cells at cross points of the plurality of word lines and the plurality of bit lines, wherein each of the plurality of antifuse memory cells comprises an antifuse element having a gate terminal coupled to one of the word lines, a drain terminal coupled to one of the bit lines, a body terminal, and a gate PN diode coupled between the word line and the gate terminal.

According to an embodiment, there is provided an antifuse memory cell array including a plurality of antifuse memory cells arrayed in a plurality of rows and a plurality of columns, the antifuse memory cell array comprising a plurality of active regions respectively disposed in the plurality of rows, a plurality of gate lines respectively disposed in the plurality of columns to intersect the active regions, each of the plurality of gate lines including first gates of one conductivity type and second gates of an opposite conductivity type that are alternately arrayed along a column direction, and a plurality of impurity junction regions in the active regions between the plurality of gate lines, wherein the first gates overlap with the active regions and the second gates are between the active regions and do not overlap with the active regions.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

It will be understood that although the terms such as "first", "second", "third" etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "under", "beneath," "below", "lower," "on", "over", "above," "upper", "side" or "aside" another element, it can be directly contact the other element, or at least one intervening element may also be present therebetween. Accordingly, the terms such as "under", "beneath," "below", "lower," "on", "over", "above," "upper", "side" "aside" and the like which are used herein are for the purpose of describing particular embodiments only and are not intended to limit the scope of the present disclosure. Other words used to describe the relationship between elements or layers should be interpreted in a like fashion (e.g., "between" versus "directly between" or "adjacent" versus "directly adjacent").

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
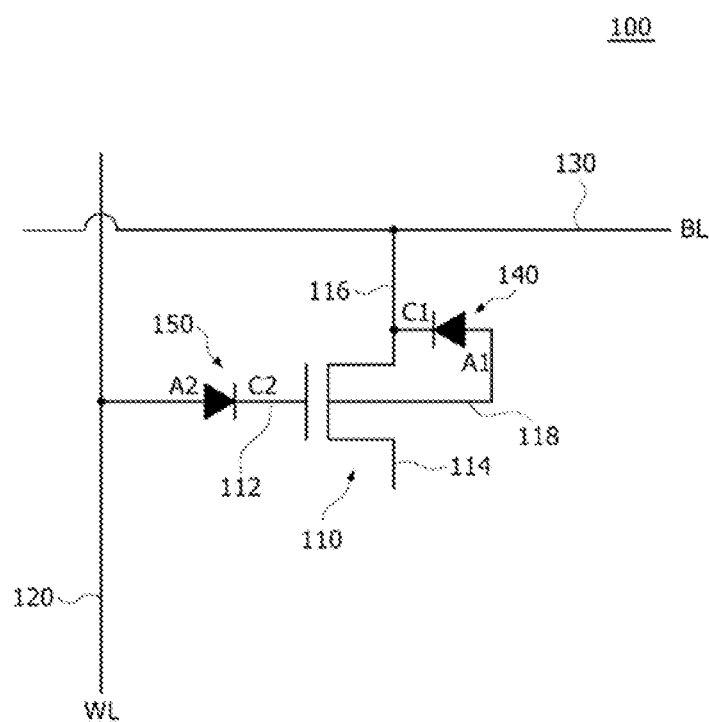
FIG. 1 is an equivalent circuit diagram illustrating an antifuse-type memory cell according to an embodiment.

FIG. 1 is an equivalent circuit diagram illustrating an antifuse-type memory cell 100 according to an embodiment. Referring to FIG. 1, the antifuse-type memory cell 100 may include an antifuse element 110 and a gate PN diode 150 which are located at a cross point of a word line (WL) 120 and a bit line (BL) 130. In some embodiments, the antifuse element 110 may be comprised of a metal-oxide-semiconductor field effect transistor (MOSFET) having a gate terminal 112, a source terminal 114, a drain terminal 116 and a body terminal 118. The antifuse element 110 may include a bulk PN diode 140 coupled between the body terminal 118 and the drain terminal 116. An anode A1 and a cathode C1 of the bulk PN diode 140 may be coupled to the body terminal 118 and the drain terminal 116, respectively. The drain terminal 116 may be coupled to the bit line 130, and the source terminal 114 may be floated. The gate terminal 112 may be coupled to the word line 120 through the gate PN diode 150. The gate PN diode 150 may have an anode A2 and a cathode C2 formed of a P-type semiconductor and an N-type semiconductor, respectively. The anode A2 and the cathode C2 of the gate PN diode 150 may be coupled to the word line 120 and the gate terminal 112, respectively. In some embodiments, the gate PN diode 150 and the gate terminal 112 may be directly combined to provide a gate structure of the antifuse element 110. That is, the gate structure of the antifuse element 110 may be comprised of a first gate having an N-type conductivity and a second gate having P-type conductivity.

In the antifuse-type memory cell 100, if a positive program voltage over a certain voltage is applied to the word line 120 and the bit line 130 is grounded, a gate insulation layer of the antifuse element 110 may be ruptured to provide a resistive current path between the gate terminal 112 and the body terminal 118. As a result, the antifuse-type memory cell 100 may be programmed. During the program operation of the antifuse-type memory cell 100, a short circuit may be provided between the word line 120 and the gate terminal 112 because a forward bias is applied between the anode A2 and the cathode C2 of the gate PN diode 150. A current path may be formed between the word line 120 and the body terminal 118. In addition, the bulk PN diode 140 may provide a current path from the body terminal 118 toward the drain terminal 116. Thus, a current path may be formed between the word line 120 and the bit line 130, and a read operation of the antifuse-type memory cell 100 may be achieved by sensing a current that flows through the current path between the word line 120 and the bit line 130.

If a cell array is realized by arraying a plurality of memory cells such as the antifuse-type memory cell 100 in a matrix form, the gate terminals 112 of the plurality of antifuse-type memory cells 100 arrayed in a single row may be connected to a single word line (e.g., the word line 120) and the drain terminals 116 of the plurality of antifuse-type memory cells 100 arrayed in a single column may be connected to a single bit line (e.g., the bit line 130). In such case, if the gate PN diode 150 is absent from each antifuse-type memory cell 100, a sneak current (i.e. a type of leakage current) may flow through a bit line connected to a selected antifuse-type memory cell from non-selected antifuse-type memory cells that share a word line or a bit line with the selected antifuse-type memory cell while the selected antifuse-type memory cell is selectively read out. As a result, the read operation of the selected antifuse-type memory cell may not be properly executed.

When the antifuse-type memory cell 100 is programmed, a gate insulation layer may be ruptured not only between the gate terminal 112 and the body terminal 118 thereof, but between the gate terminal 112 and the drain terminal 116 thereof. A parasitic current path through which a sneak current flows may be formed between the gate terminal 112 and the drain terminal 116 of the antifuse-type memory cell 100. Thus, an electrical short circuit may be provided between the gate terminal 112 and the drain terminal 116 of the antifuse-type memory cell 100. Accordingly, if the gate PN diode 150 is absent from the antifuse-type memory cell 100, an electrical short circuit may be provided between the word line 120 and the bit line 130 connected to the antifuse-type memory cell 100, and a sneak current path may exist between the word line 120 and the bit line 130 regardless of a polarity of a bias applied between the word line 120 and the bit line 130. In this case, the read operation of a selected antifuse-type memory cell may not be properly executed as described above. However, the antifuse-type memory cell 100 according to the present embodiment may include the gate PN diode 150 having the anode A2 connected to the word line 120 and the cathode C2 connected to the gate terminal 112. Thus, even though a gate insulation layer between the gate terminal 112 and the drain terminal 116 is ruptured to provide a parasitic current path, the gate PN diode 150 may block a current that flows from the bit line 130 toward the word line 120. Therefore, the gate PN diode 150 may prevent an erroneous read operation due to the sneak current.

Figure 2:
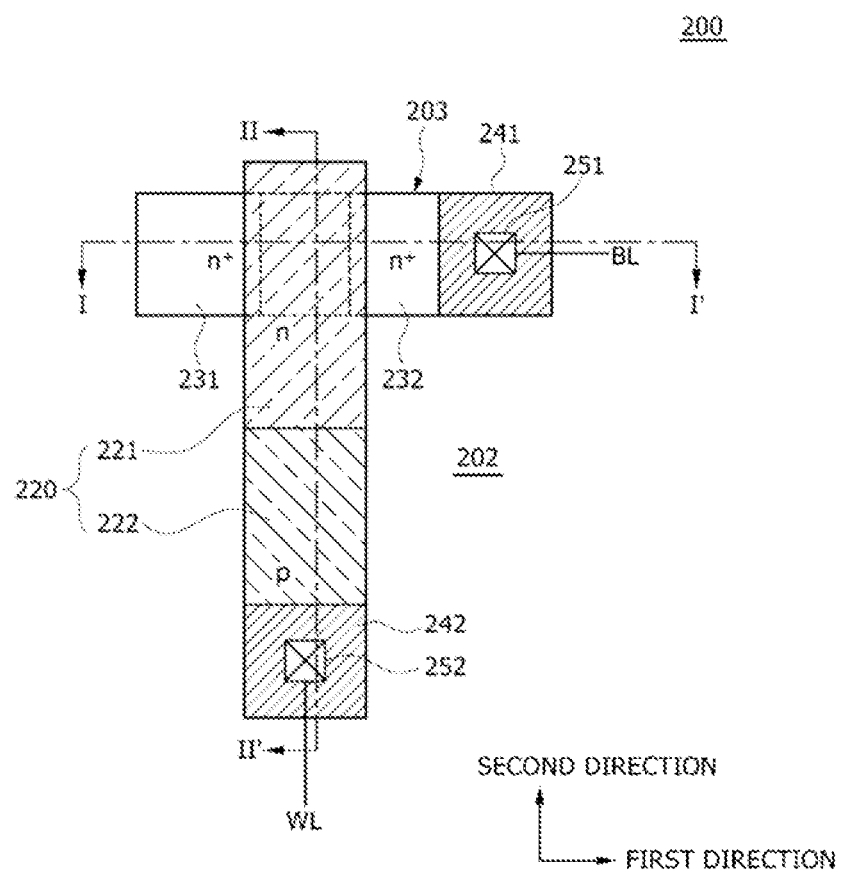
FIG. 2 is a layout diagram illustrating an antifuse-type memory cell according to an embodiment.
Figure 3:
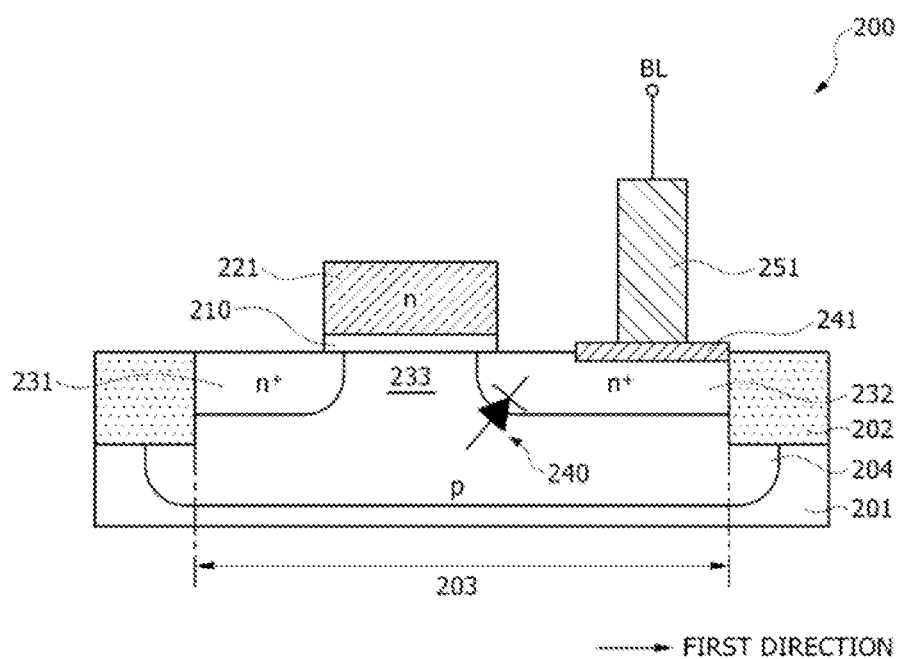
FIG. 3 is a cross-sectional view taken along a line I-I' of FIG. 2.
Figure 4:
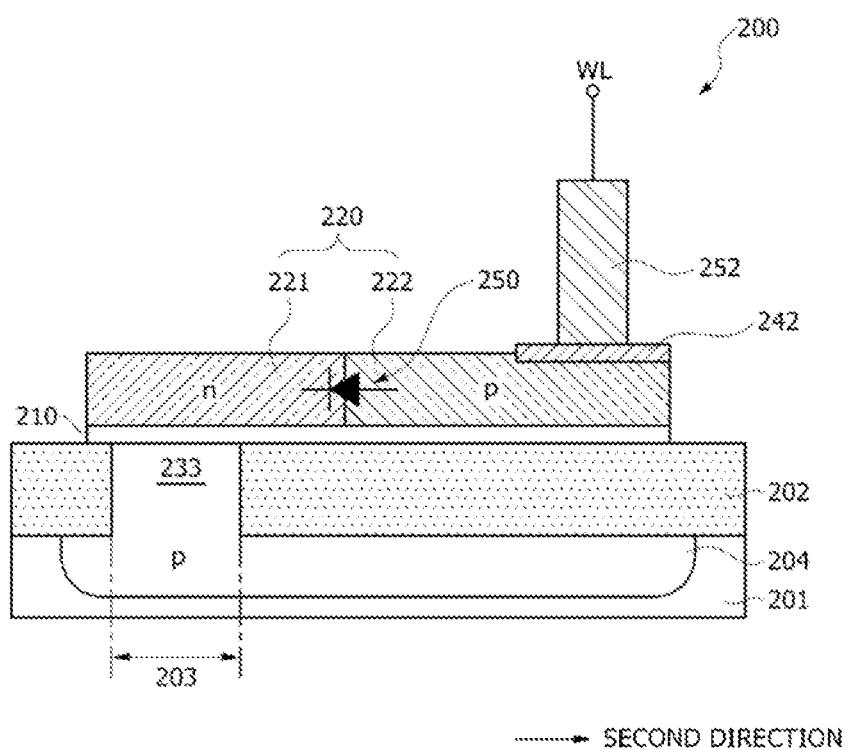
FIG. 4 is a cross-section view taken along a line II-II' of FIG. 2.

FIG. 2 is a layout diagram illustrating an antifuse-type memory cell 200 according to an embodiment. FIG. 3 is a cross-sectional view taken along a line I-I' of FIG. 2, and FIG. 4 is a cross-sectional view taken along a line II-II' of FIG. 2. Referring to FIGS. 2, 3 and 4, a P-type body 204 may be disposed in a portion of an upper region of a substrate 201. In some embodiments, the body 204 may be a well region which is formed by implanting impurity ions into the substrate 201 and by diffusing the impurity ions with an annealing process. In other embodiments, if the substrate 201 is a P-type substrate, the substrate 201 may act as the body 204. A trench isolation layer 202 may be disposed in a certain upper region of the substrate 201. The trench isolation layer 202 may define an active region 203. The active region 203 may be defined in the body 204.

In some embodiments, the active region 203 may extend in a first direction to have a stripe shape or a line shape. A first impurity junction region 231 having N-type conductivity and a second impurity junction region 232 having N-type conductivity may be disposed in the active region 203 to be spaced apart from each other. The first and second impurity junction regions 231 and 232 may be separated from each other by a channel region 233 therebetween. The first impurity junction region 231, the channel region 233 and the second impurity junction region 232 may be sequentially arrayed along the first direction. In some embodiments, the first impurity junction region 231 and the second impurity junction region 232 may correspond to a source region and a drain region, respectively. Alternatively, in some other embodiments, the first impurity junction region 231 and the second impurity junction region 232 may be a drain region and a source region, respectively. The channel region 233 between the first and second impurity junction regions 231 and 232 may correspond to a portion of an upper region of the body 204. Thus, the channel region 233 may also have P-type conductivity. Although not shown in the drawings, in some embodiments, each of the first and second impurity junction regions 231 and 232 may have a lightly doped drain (LDD) structure. That is, each of the first and second impurity junction regions 231 and 232 may include a shallow extension region lightly doped with N-type impurities and a deep region heavily doped with N-type impurities.

A first silicide layer 241 may be disposed on a portion of the second impurity junction region 232. A first contact plug 251 may be disposed on the first silicide layer 241. The first contact plug 251 may be coupled to a bit line BL. In some embodiments, the first impurity junction region 231 may be electrically floated. In some other embodiments, the first impurity junction region 231 may be absent from the antifuse-type memory cell 200. The body 204 having P-type conductivity and the second impurity junction region 232 having N-type conductivity may constitute a PN junction. That is, the body 204 and the second impurity junction region 232 may constitute a bulk PN diode 240. The body 204 may correspond to an anode of the bulk PN diode 240, and the second impurity junction region 232 may correspond to a cathode of the bulk PN diode 240.

A gate electrode 220 may be disposed on the channel region 233 and may be insulated from the channel region 233 by an insulation layer 210, that is, a gate insulation layer. The gate electrode 220 may be disposed to intersect the active region 203 and to extend onto the isolation layer 202. In some embodiments, the gate electrode 220 may extend in a second direction intersecting the first direction to have a stripe shape or a line shape. The gate electrode 220 may include a first gate electrode 221 and a second gate electrode 222. The first gate electrode 221 may have N-type conductivity, and the second gate electrode 222 may have P-type conductivity. In some embodiments, the first gate electrode 221 may be a conductive layer doped with N-type impurities (e.g., an N-type polysilicon layer), and the second gate electrode 222 may be a conductive layer doped with P-type impurities (e.g., a P-type polysilicon layer). The first gate electrode 221 and the second gate electrode 222 may constitute a gate PN diode 250. The first gate electrode 221 having N-type conductivity may correspond to a cathode of the gate PN diode 250, and the second gate electrode 222 having P-type conductivity may correspond to an anode of the gate PN diode 250. The first gate electrode 221 may overlap with the active region 203 (i.e., the channel region 233) whereas the second gate electrode 222 may not overlap with the active region 203. The first gate electrode 221 may also overlap with a portion of the second impurity junction region 232 electrically coupled to the bit line BL. A second silicide layer 242 may be disposed on the second gate electrode 222. A second contact plug 252 may be disposed on the second silicide layer 242. The second contact plug 252 may be coupled to a word line WL.

The antifuse-type memory cell 200 may be programmed by rupturing the insulation layer 210 between the gate electrode 220 and the active region 203. That is, while a program operation of the antifuse-type memory cell 200 is executed, a portion of the insulation layer 210 between the gate electrode 220 and the body 204 (i.e., the channel region 233) may be ruptured. In such case, the program operation will be referred to as a first type of program operation and the antifuse-type memory cell 200 will be referred to as a first type of programmed cell throughout the specification. Alternatively, while the program operation of the antifuse-type memory cell 200 is executed, a portion of the insulation layer 210 between the gate electrode 220 and the second impurity junction region 232 may be ruptured. In such case, the program operation will be referred to as a second type of program operation and the antifuse-type memory cell 200 will be referred to as a second type of programmed cell. The first and second types of program operations may be executed under the same program bias condition. In either case, a read operation of the antifuse-type memory cell 200 including the gate PN diode 250 may be properly executed without any errors that are due to sneak current.

Figure 5:
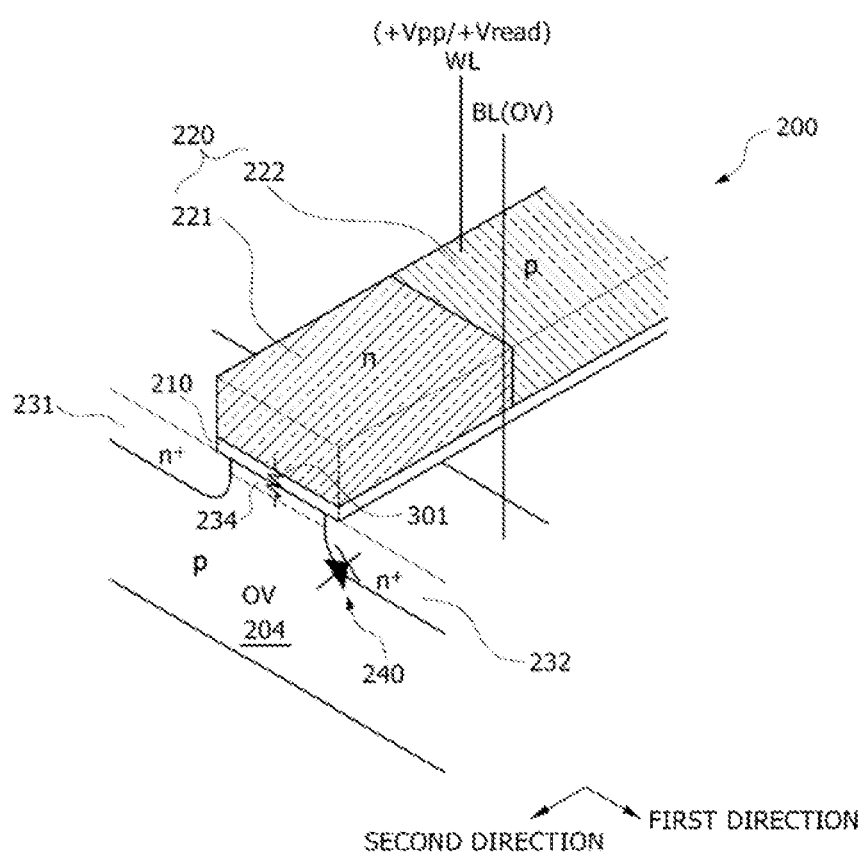
FIG. 5 is a cutaway perspective view illustrating a first type of program operation of the antifuse-type memory cell 200 shown in FIGS. 2, 3 and 4 and illustrating a read operation of a first type of programmed cell.
Figure 6:
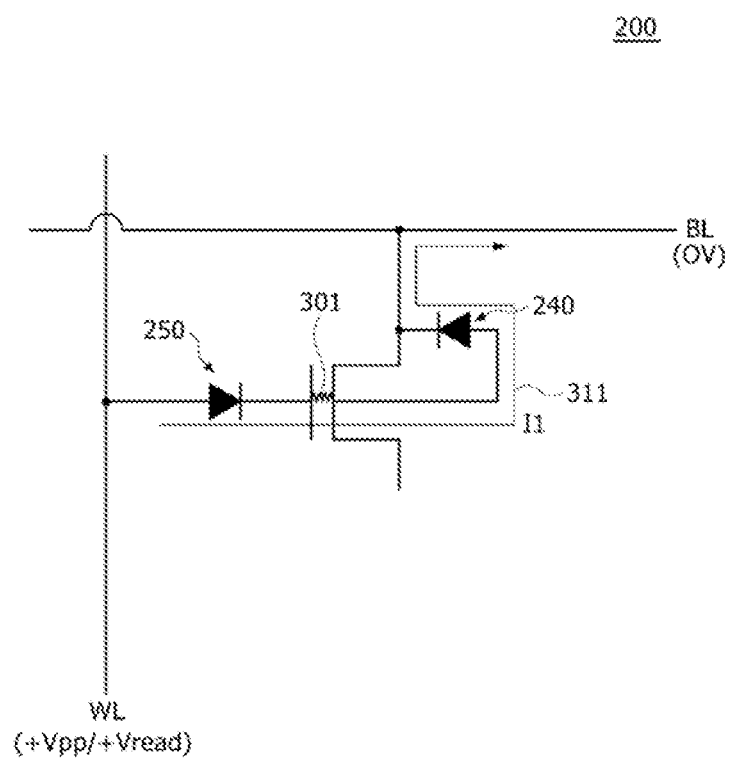
FIG. 6 is an equivalent circuit diagram illustrating a first type of program operation of an antifuse-type memory cell according to an embodiment and illustrating a read operation of the first type of programmed cell.

FIG. 5 is a cutaway perspective view illustrating the first type of program operation of the antifuse-type memory cell 200 shown in FIGS. 2, 3 and 4 and the read operation of the first type of programmed cell, and FIG. 6 is an equivalent circuit diagram illustrating the first type of program operation of the antifuse-type memory cell 200 shown in FIGS. 2, 3 and 4 and the read operation of the first type of programmed cell. During a program operation, the antifuse-type memory cell 200 may be ruptured or not depending on the program data. It is described in FIGS. 5 and 6 that the antifuse-type memory cell 200 is ruptured to program first program data. Referring to FIGS. 5 and 6, in order to program the antifuse-type memory cell 200, a positive program voltage +Vpp may be applied to the word line WL, and the bit line BL and the body 204 may be grounded. The positive program voltage +Vpp may be set to be higher than a turn-on voltage (i.e., a threshold voltage) for turning on the antifuse-type memory cell 200 having a MOSFET structure in order to rupture the insulation layer 210. In some embodiments, the positive program voltage +Vpp may be within a range of about 6 volts to about 20 volts. If the positive program voltage +Vpp higher than the turn-on voltage of the antifuse-type memory cell 200 is applied to the word line WL, an inversion layer having N-type conductivity may be formed in the channel region 233 and a tunneling current may flow through the insulation layer 210. If the tunneling current flows through the insulation layer 210, additional traps may be formed in the insulation layer 210 to increase an amount of the tunneling current flowing through the insulation layer 210. As a result, the insulation layer 210 may eventually be ruptured to form a resistive current path 301 in the insulation layer 210 between the first gate electrode 221 and the body 204. If the resistive current path 301 is formed in the insulation layer 210, the antifuse-type memory cell 200 may be programmed with the first program data.

In order to read the programmed antifuse-type memory cell 200 (i.e., the first type of programmed cell), a positive read voltage +Vread may be applied to the word line WL, and the bit line BL and the body 204 may be grounded. The positive read voltage +Vread may be set to have such a voltage level that any resistive current path may not be formed in the insulation layer 210. Under the above read bias condition, when the antifuse-type memory cell 200 is ruptured to program the first program data, a current I1 may flow along a current path which is comprised of the word line WL, the gate PN diode 250 (i.e., the first and second gate electrodes 221 and 222), the resistive current path 301, the bulk PN diode 240 (i.e., the body 204 and the second impurity junction region 232) and the bit line BL, as indicated by an arrow 311 in FIG. 6. Accordingly, the antifuse-type memory cell 200 may be programmed with the first program data by sensing the current I1 flowing through the bit line BL. Alternatively, when the antifuse-type memory cell 200 is not ruptured to program second program data other than the first program data, no resistive current path 301 exists in the insulation layer 210. In such case, no current flows from the gate electrode 220 toward the body 204 through the insulation layer 210 under the above read bias condition. Thus, no current flows through the bit line BL. Accordingly, the antifuse-type memory cell 200 may be programmed with the second program data if no current flows through the bit line BL.

Figure 7:
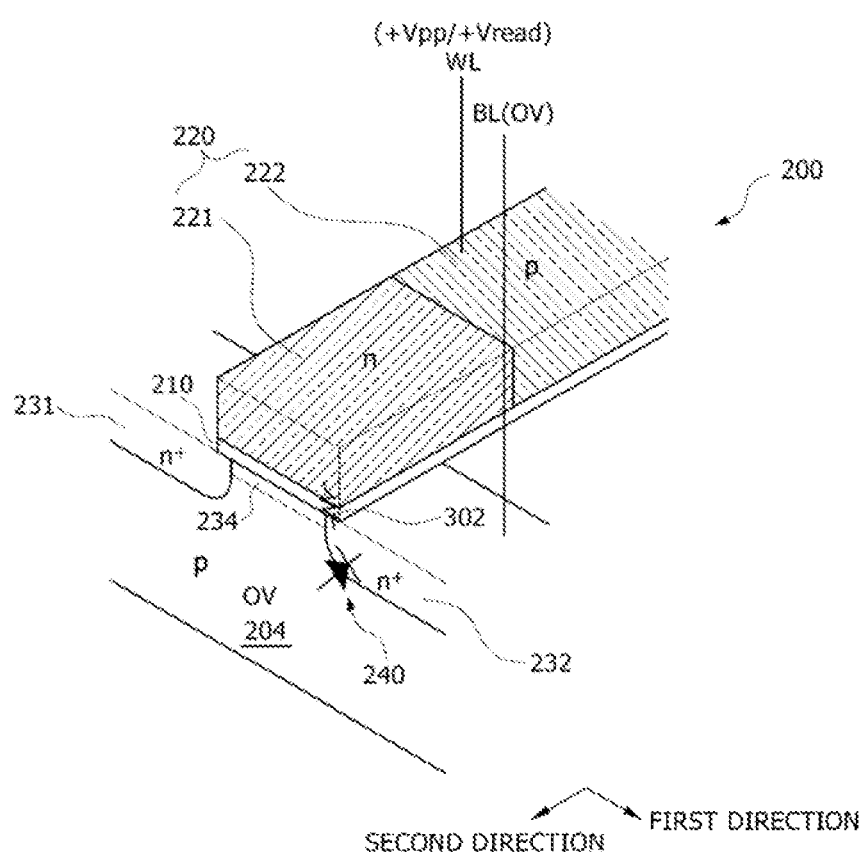
FIG. 7 is a cutaway perspective view illustrating a second type of program operation of an antifuse-type memory cell according to an embodiment and illustrating a read operation of the second type of programmed cell.
Figure 8:
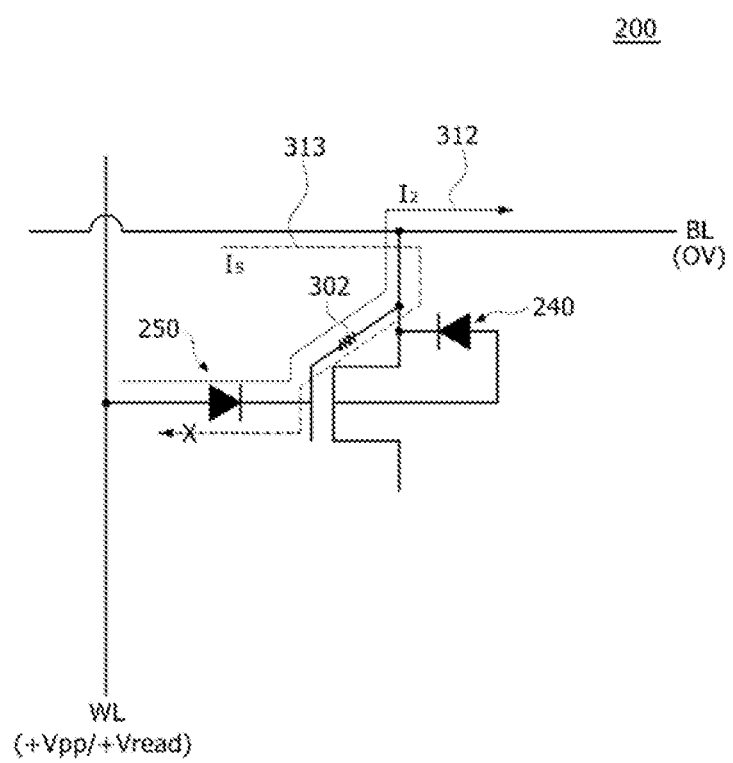
FIG. 8 is an equivalent circuit diagram illustrating a second type of program operation of an antifuse-type memory cell according to an embodiment and a read operation of the second type of programmed cell together with a sneak current blocking mechanism.

FIG. 7 is a cutaway perspective view illustrating the second type of program operation of the antifuse-type memory cell 200 shown in FIGS. 2, 3 and 4 and illustrating the read operation of the second type of programmed cell, and FIG. 8 is an equivalent circuit diagram illustrating the second type of program operation of the antifuse-type memory cell 200 shown in FIGS. 2, 3 and 4 and the read operation of the second type of programmed cell together with a sneak current blocking mechanism. During a program operation, the antifuse-type memory cell 200 may be ruptured or not depending on the program data. It is described in FIGS. 7 and 8 that the antifuse-type memory cell 200 is ruptured to program first program data. Referring to FIGS. 7 and 8, in order to program the antifuse-type memory cell 200, a positive program voltage +Vpp may be applied to the word line WL, and the bit line BL and the body 204 may be grounded. The positive program voltage +Vpp may be set higher than a turn-on voltage (i.e., a threshold voltage) for turning on the antifuse-type memory cell 200 having a MOSFET structure in order to rupture the insulation layer 210. In some embodiments, the positive program voltage +Vpp may be within a range of about 6 volts to about 20 volts. In such case, the antifuse-type memory cell 200 may be programmed by substantially the same mechanism as described with reference to FIGS. 5 and 6. The only difference between the previous embodiment illustrated in FIGS. 5 and 6 and the present embodiment illustrated in FIGS. 7 and 8 is that a resistive current path 302 may be formed in the insulation layer 210 between the first gate electrode 221 and the second impurity junction region 232 according to the present embodiment while the resistive current path 301 is formed in the insulation layer 210 between the first gate electrode 221 and the body 204 according to the previous embodiment illustrated in FIGS. 5 and 6. Accordingly, an electrical short circuit may be provided between the first gate electrode 221 and the second impurity junction region 232 of the antifuse-type memory cell 200, and the read operation may be executed regardless of the bulk PN diode 240 in the present embodiment. That is, even though the resistive current path 302 may be formed in the insulation layer 210 between the first gate electrode 221 and the second impurity junction region 232, the antifuse-type memory cell 200 may be programmed with the first program data.

In order to read the programmed antifuse-type memory cell 200 having the resistive current path 302 (i.e., the second type of programmed cell) the positive read voltage +Vread may be applied to the word line WL, and the bit line BL and the body 204 may be grounded. The positive read voltage +Vread may be set to have such a voltage level that any resistive current path may not be formed in the insulation layer 210. Under the above read bias condition, when the antifuse-type memory cell 200 is ruptured to program the first program data, a current I2 may flow along a current path which is comprised of the word line WL, the gate PN diode 250 (i.e., the first and second gate electrodes 221 and 222), the resistive current path 302 and the bit line BL, as indicated by an arrow 312 in FIG. 8. Accordingly, the antifuse-type memory cell 200 may be programmed with the first program data by sensing the current I2 flowing through the bit line BL. Alternatively, when the antifuse-type memory cell 200 is not ruptured to program second program data other than the first program data, no resistive current path exists in the insulation layer 210. In such case, no current flows from the gate electrode 220 toward the bit line BL though the insulation layer 210 under the above read bias condition. Thus, no current flows through the bit line BL. Accordingly, the antifuse-type memory cell 200 may be programmed with the second program data if no current flows through the bit line BL.

While the programmed antifuse-type memory cell 200 (i.e., the first type of programmed cell) having the resistive current path 301 illustrated in FIGS. 5 and 6 is under the read bias condition, current flowing from the bit line BL toward the word line WL is blocked by the bulk PN diode 240 and the gate PN diode 250. Accordingly, even though a sneak current generated from other antifuse-type memory cells flows through the bit line BL, the sneak current may not flow through the word line WL. In the meantime, while the programmed antifuse-type memory cell 200 (i.e., the second type of programmed cell) having the resistive current path 302 illustrated in FIGS. 7 and 8 is under the read bias condition, an electrical short circuit may occur between the gate electrode 220 and the second impurity junction region 232. Thus, sneak current may flow from the bit line BL toward the gate electrode 220 through the resistive current path 302 in the insulation layer 210. That is, the bulk PN diode 240 cannot block sneak current that flows from the bit line BL toward the gate electrode 220. However, even though a sneak current Is flows through the bit line BL and the resistive current path 302 exists in the insulation layer 210, the sneak current Is cannot flow toward the word line WL because of the presence of the gate PN diode 250.

Figure 9:
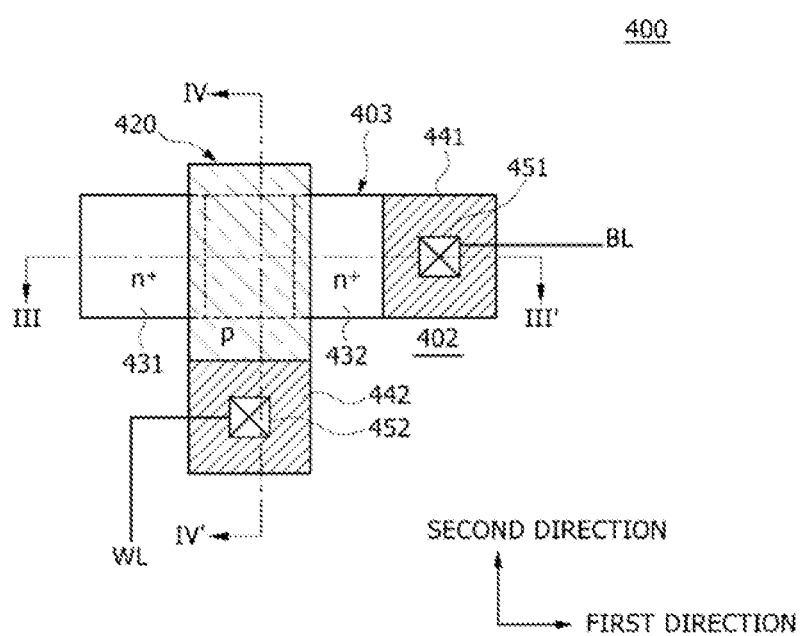
FIG. 9 is a layout diagram illustrating an antifuse-type memory cell according to another embodiment.
Figure 10:
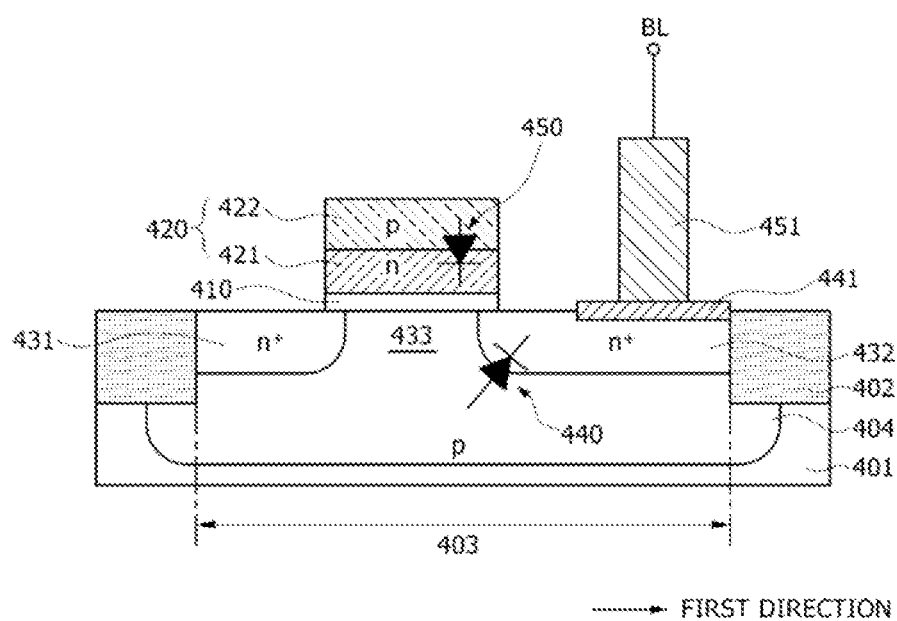
FIG. 10 is a cross-sectional view taken along a line III-III' of FIG. 9.
Figure 11:
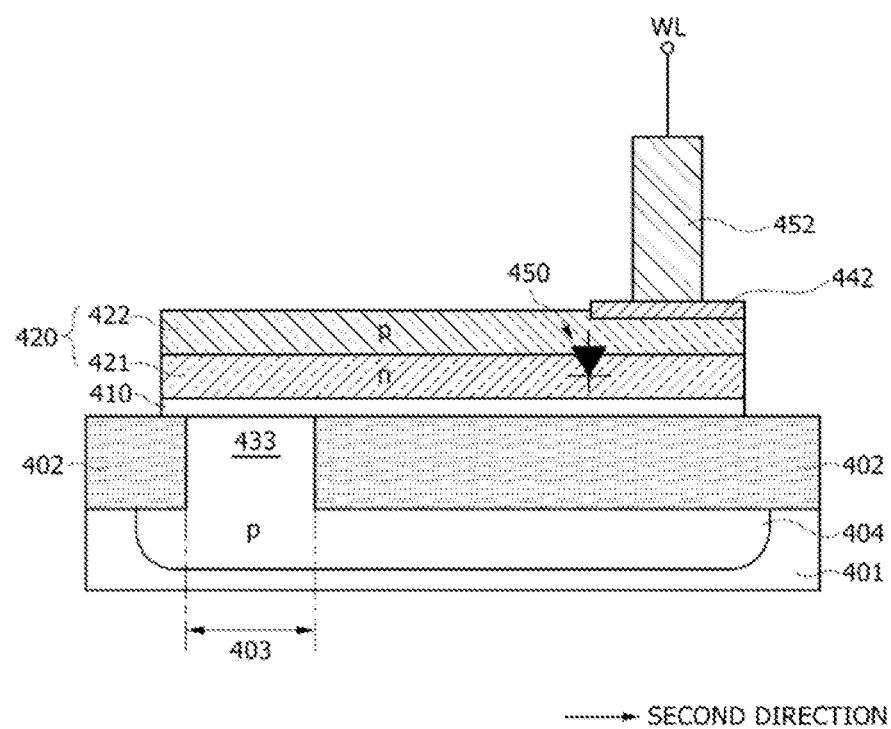
FIG. 11 is a cross-sectional view taken along a line IV-IV' of FIG. 9.

FIG. 9 is a layout diagram illustrating an antifuse-type memory cell 400 according to another embodiment. FIG. 10 is a cross-sectional view taken along a line III-III' of FIG. 9, and FIG. 11 is a cross-sectional view taken along a line IV-IV' of FIG. 9. A program operation and a read operation of the antifuse-type memory cell 400 may be substantially the same as those of the antifuse-type memory cell 200 described with reference to FIGS. 5, 6, 7 and 8. Referring to FIGS. 9, 10 and 11, a P-type body 404 may be disposed in a portion of an upper region of a substrate 401. In some embodiments, the body 404 may be a well region which is formed by implanting impurity ions into the substrate 401 and by diffusing the impurity ions with an annealing process. In other embodiments, if the substrate 401 is a P-type substrate, the substrate 401 may act as the body 404. A trench isolation layer 402 may be disposed in a certain upper region of the substrate 401. The trench isolation layer 402 may define an active region 403. The active region 403 may be defined in the body 404.

In some embodiments, the active region 403 may extend in a first direction to have a stripe shape or a line shape. A first impurity junction region 431 having N-type conductivity and a second impurity junction region 432 having N-type conductivity may be disposed in the active region 403 to be spaced apart from each other. The first and second impurity junction regions 431 and 432 may be separated from each other by a channel region 433 therebetween. The first impurity junction region 431, the channel region 433 and the second impurity junction region 432 may be sequentially arrayed along the first direction. In some embodiments, the first impurity junction region 431 and the second impurity junction region 432 may correspond to a source region and a drain region, respectively. Alternatively, in some other embodiments, the first impurity junction region 431 and the second impurity junction region 432 may be a drain region and a source region, respectively. The channel region 433 between the first and second impurity junction regions 431 and 432 may correspond to a portion of an upper region of the body 404. Thus, the channel region 433 may also have P-type conductivity. Although not shown in the drawings, in some embodiments, each of the first and second impurity junction regions 431 and 432 may have a lightly doped drain (LDD) structure. That is, each of the first and second impurity junction regions 431 and 432 may include a shallow extension region lightly doped with N-type impurities and a deep region heavily doped with N-type impurities.

A first silicide layer 441 may be disposed on a portion of the second impurity junction region 432. A first contact plug 451 may be disposed on the first silicide layer 441. The first contact plug 451 may be coupled to a bit line BL. In some embodiments, the first impurity junction region 431 may be electrically floated. In other embodiments, the first impurity junction region 431 may be absent in the antifuse-type memory cell 400. The body 404 having P-type conductivity and the second impurity junction region 432 having N-type conductivity may constitute a PN junction. That is, the body 404 and the second impurity junction region 432 may constitute a bulk PN diode 440. The body 404 may correspond to an anode of the bulk PN diode 440, and the second impurity junction region 432 may correspond to a cathode of the bulk PN diode 440.

A gate electrode 420 may be disposed on the channel region 433 and may be insulated from the channel region 433 by an insulation layer 410, that is, a gate insulation layer. The gate electrode 420 may be disposed to intersect the active region 403 and to extend onto the isolation layer 402. In some embodiments, the gate electrode 420 may extend in a second direction intersecting the first direction to have a stripe shape or a line shape. The gate electrode 420 may include a first gate electrode 421 and a second gate electrode 422 which are sequentially stacked on the insulation layer 410. That is, a bottom surface of the first gate electrode 421 may be in contact with a top surface of the insulation layer 410, and a bottom surface of the second gate electrode 422 may be in contact with a top surface of the first gate electrode 421. The first gate electrode 421 may have N-type conductivity, and the second gate electrode 422 may have P-type conductivity. In some embodiments, the first gate electrode 421 may be a conductive layer doped with N-type impurities (e.g., an N-type polysilicon layer), and the second gate electrode 422 may be a conductive layer doped with P-type impurities (e.g. a P-type polysilicon layer). The first gate electrode 421 and the second gate electrode 422 may constitute a gate PN diode 450. The first gate electrode 421 having N-type conductivity may correspond to a cathode of the gate PN diode 450, and the second gate electrode 422 having P-type conductivity may correspond to an anode of the gate PN diode 450. The first gate electrode 421 may overlap with the active region 403, particularly, the channel region 433 and may also overlap with a portion of the second impurity junction region 432 electrically coupled to the bit line BL. A second silicide layer 442 may be disposed on the second gate electrode 422. A second contact plug 452 may be disposed on the second silicide layer 442. The second contact plug 452 may be coupled to a word line WL.

Figure 12:
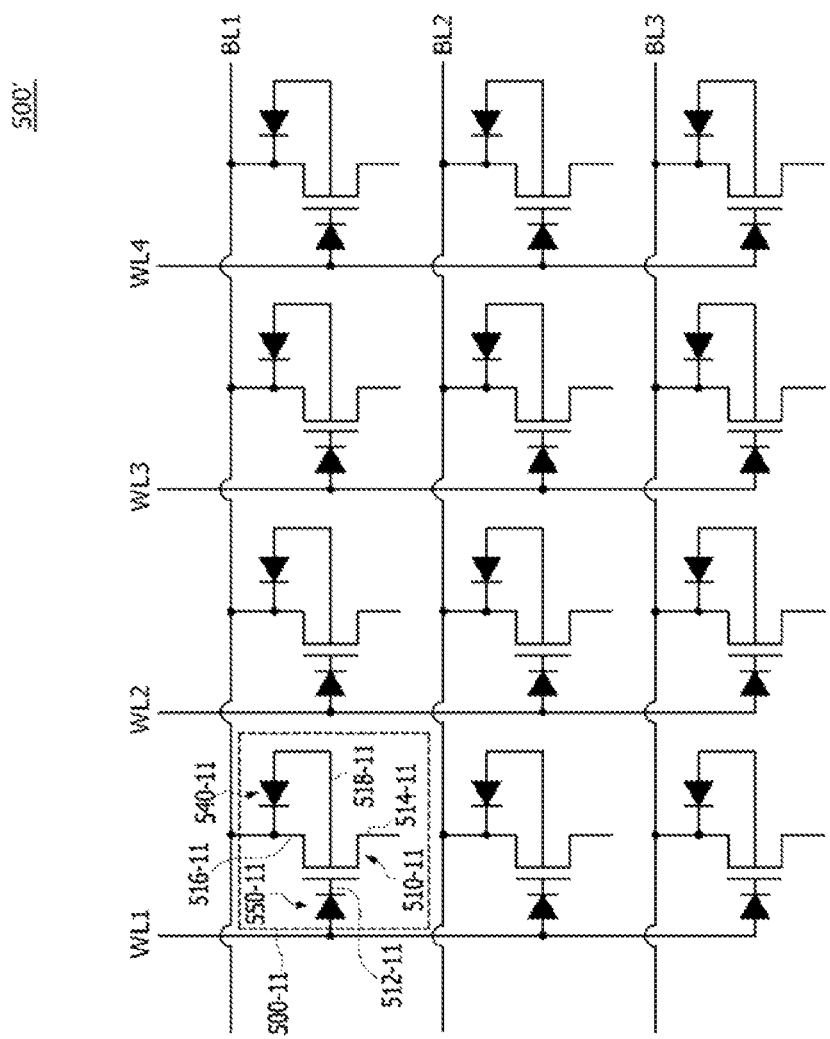
FIG. 12 is an equivalent circuit diagram illustrating an antifuse-type memory cell array according to an embodiment.

FIG. 12 is an equivalent circuit diagram illustrating an antifuse-type memory cell array 500' according to an embodiment. Referring to FIG. 12, the antifuse-type memory cell array 500' may include a plurality of word lines (e.g., first to fourth word lines WL1~WL4) extending in one direction (e.g., a vertical direction in the drawing) and a plurality of bit lines (e.g., first to third bit lines BL1~BL3) extending in another direction (e.g., a horizontal direction in the drawing) intersecting the one direction. Each of the first to fourth word lines WL1~WL4 may be disposed in columns, and each of the first to third bit lines BL1~BL3 may be disposed in rows. The rows and the columns may be interchanged. Thus, columns (or rows) in some embodiments could be termed rows (or columns) in other embodiments without departing from the teachings of the present disclosure. For example, even though word lines are respectively disposed in rows in some embodiments the word lines may be respectively disposed in columns in other embodiments. Moreover, the number of the word lines and the number of the bit lines disposed in the antifuse-type memory cell array 500' may be set to be different according to the embodiments. A plurality of antifuse-type memory cells may be located at cross points of the word lines WL1~WL4 and the bit lines BL1~BL3 respectively. The antifuse-type memory cells arrayed in the same row may share one of the bit lines BL1~BL3 with each other, and the antifuse-type memory cells arrayed in the same column may share one of the word lines WL1~WL4 with each other.

Each of the plurality of antifuse-type memory cells may have the same configuration as described with reference to FIG. 1. For example, an antifuse-type memory cell 500-11 located at a cross point of the first word line WL1 and the first bit line BL1 may include an antifuse element 510-11 and a gate PN diode 550-11. The antifuse element 510-11 may be a MOSFET having a gate terminal 512-11, a source terminal 514-11, a drain terminal 516-11 and a body terminal 518-11. The body terminal 518-11 may be coupled to the drain terminal 516-11 through a bulk PN diode 540-11. An anode and a cathode of the bulk PN diode 540-11 may be coupled to the body terminal 518-11 and the drain terminal 516-11 respectively. The drain terminal 516-11 may be coupled to the first bit line BL1. The source terminal 514-11 may be floated. The gate terminal 512-11 may be coupled to the first word line WL1 through the gate PN diode 550-11. The gate PN diode 550-11 may have an anode and a cathode formed of a P-type semiconductor and N-type semiconductor, respectively. The anode and cathode of the gate PN diode 550-11 may be coupled to the first word line WL1 and the gate terminal 512-11, respectively.

In order to selectively program the antifuse-type memory cell 500-11 with the first program data, a positive program voltage may be applied to the first word line WL1 connected to the selected antifuse-type memory cell 500-11 and the first bit line BL1 connected to the selected antifuse-type memory cell 500-11 may be grounded. The remaining word lines WL2 and the remaining bit lines BL2 and BL3 may be floated. As a result of the program operation of the selected antifuse-type memory cell 500-11, a resistive current path may be formed between the gate terminal 512-11 and the body terminal 518-11 or between the gate terminal 512-11 and the drain terminal 516-11, as described with reference to FIGS. 5 to 8. Non-selected antifuse-type memory cells, which are arrayed in a first row to share the first bit line BL1 with the selected antifuse-type memory cell 500-11, may not be programmed because the second to fourth word lines WL2~WL4 are floated. Non-selected antifuse-type memory cells, which are arrayed in a first column to share the first word line WL1 with the selected antifuse-type memory cell 500-11, may not be programmed because the second and third bit lines BL2 and BL3 are floated. Non-selected antifuse-type memory cells, which are located at cross points of second to fourth columns and second and third rows so that they do not share any word lines or any bit lines with the selected antifuse-type memory cell 500-11, may not be programmed because all of the second to fourth word lines WL2~WL4 and the second and third bit lines BL2 and BL3 are floated.

In order to read out a datum stored in the selected antifuse-type memory cell 500-11, a positive read voltage may be applied to the first word line WL1 connected to the selected antifuse-type memory cell 500-11 and the first bit line BL1 connected to the selected antifuse-type memory cell 500-11 may be grounded. The remaining word lines WL2~WL4 and the remaining bit lines BL2 and BL3 may be floated. If the selected antifuse-type memory cell 500-11 is programmed with the first program data, a resistive current path is formed between the gate terminal 512-11 and the body terminal 518-11 or between the gate terminal 512-11 and the drain terminal 516-11. A current may flow from the first word line WL1 toward the first bit line BL1 through the resistive current path under the above read bias condition. Thus, the selected antifuse-type memory cell 500-11 may be programmed with the first program data by sensing a current that flows through the first bit line BL1. If the selected antifuse-type memory cell 500-11 is programmed with the second program data, a resistive current path is not formed between the gate terminal 512-11 and the body terminal 518-11 and between the gate terminal 512-11 and the drain terminal 516-11. No current flows from the first word line WL1 toward the first bit line BL1 under the above read bias condition. Since the second to fourth word lines WL2~WL4 connected to other antifuse-type memory cells (i.e., non-selected antifuse-type memory cells) which are arrayed in a first row to share the first bit line BL1 with the selected antifuse-type memory cell 500-11 are floated, no parasitic current may flow from the second to fourth word lines WL2~WL4 toward the first bit line BL1. Thus, a read operation of the selected antifuse-type memory cell 500-11 may not be affected by the non-selected antifuse-type memory cells sharing the first bit line BL1 with the selected antifuse-type memory cell 500-11 regardless of whether the non-selected antifuse-type memory cells are programmed state.

Figure 13:
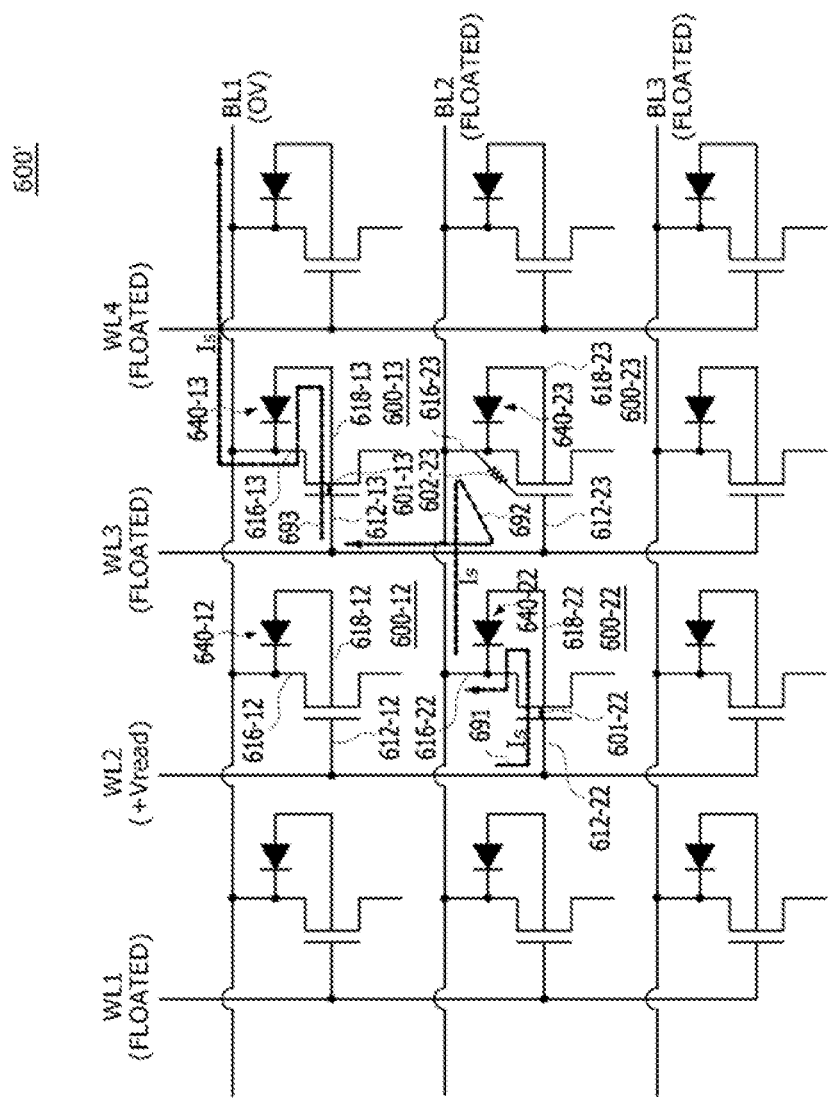
FIG. 13 is an equivalent circuit diagram illustrating a malfunction due to a sneak current generated during a read operation of a conventional antifuse-type memory cell array.

FIG. 13 is an equivalent circuit diagram illustrating a malfunction which is due to a sneak current generated during a read operation of a conventional antifuse-type memory cell array 600'. In the conventional antifuse-type memory cell array 600', word lines WL1~WL4 are directly connected to gate terminals of charge storage elements without interposition of gate PN diodes. Referring to FIG. 13, in order to selectively read out a datum stored in an antifuse-type memory cell 600-12 located at a cross point of a first row and a second column, a positive read voltage +Vread may be applied to the second word line WL2 and the first bit line BL1 may be grounded. The remaining word lines WL1, WL3 and WL4 and the remaining bit lines BL2 and BL3 may be floated. Under the above read bias condition, a sense amplifier (not shown) connected to the first bit line BL1 may sense a current flowing through the first bit line BL1 to discriminate program data of the selected antifuse-type memory cell 600-12. If the selected antifuse-type memory cell 600-12 is programmed with the first program data to have a resistive current path between a gate terminal 612-12 and a body terminal 618-12 or between the gate terminal 612-12 and a drain terminal 616-12, a current may flow from the second word line WL2 toward the first bit line BL1 through a bulk PN diode 640-12 coupled between the body terminal 618-12 and the drain terminal 616-12 or without passing through the bulk PN diode 640-12. In contrast, if the selected antifuse-type memory cell 600-12 is programmed with the second program data without a resistive current path between the gate terminal 612-12 and the body terminal 618-12 or between the gate terminal 612-12 and the drain terminal 616-12, no current may flow from the second word line WL2 toward the first bit line BL1.

Hereinafter, a read operation of the selected antifuse-type memory cell 600-12 programmed with the second program data will be described. Accordingly, when the read operation of the selected antifuse-type memory cell 600-12 is executed, no current may flow through the first bit line BL1. If a current flows through the first bit line BL1 during the read operation, the read operation may not be properly executed and cause a malfunction in which the selected antifuse-type memory cell 600-12 is regarded as being programmed with the first program data other than the second program data. For example, the read operation of the selected antifuse-type memory cell 600-12 may be executed when non-selected antifuse-type memory cells 600-22 and 600-13, respectively sharing the second word line WL2 and the first bit line BL1 with the selected antifuse-type memory cells 600-12 as well as a non-selected antifuse-type memory cell 600-23 sharing the second bit line BL2 with the non-selected antifuse-type memory cell 600-22 and sharing the third word line WL3 with the non-selected antifuse-type memory cell 600-13, are programmed with the first program data to have resistive current paths. Particularly, the non-selected antifuse-type memory cell 600-23 is programmed to have a resistive current path 602-23 which is formed between a gate terminal 612-23 and a drain terminal 616-23 to provide an electrical short circuit between the third word line WL3 and the second bit line BL2, as described with reference to FIGS. 7 and 8. In such case, a resistive current path of the non-selected antifuse-type memory cell 600-22 (or 600-13) may be formed either between a gate terminal 612-22 (or 612-13) and a drain terminal 616-22 (or 616-13) or between the gate terminal 612-22 (or 612-13) and a body terminal 618-22 (or 618-13). However, it will be described as an example that a resistive current path 601-22 (or 601-13) of the non-selected antifuse-type memory cell 600-22 (or 600-13) is formed between the gate terminal 612-22 (or 612-13) and the body terminal 618-22 (or 618-13).

Under the above read bias condition, a sneak current Is may flow from the second word line WL2 toward the second bit line BL2 through the gate terminal 612-22, the resistive current path 601-22, the body terminal 618-22, a bulk PN diode 640-22 and the drain terminal 616-22 of the non-selected antifuse-type memory cell 666-22, as indicated by an arrow 691. This sneak current Is may continuously flow from the second bit line BL2 toward the third word line WL3 through the drain terminal 616-23, the resistive current path 602-23 and the gate terminal 612-23 of the non-selected antifuse-type memory cell 600-23, as indicated by an arrow 692. This sneak current Is may continuously flow from the third word line WL3 toward the first bit line BL1 through the gate terminal 612-13, the resistive current path 601-13 the body terminal 618-13, a bulk PN diode 640-13 and the drain terminal 616-13 of the non-selected antifuse-type memory cell 600-13, as indicated by an arrow 693. Thus, the sneak current Is may be sensed by the sense amplifier (not shown) connected to the first bit line BL1 to cause an erroneous read operation in which the selected antifuse-type memory cell 600-12 is regarded as being programmed with the first program data even though the selected antifuse-type memory cell 600-12 is programmed with the second program data.

Figure 14:
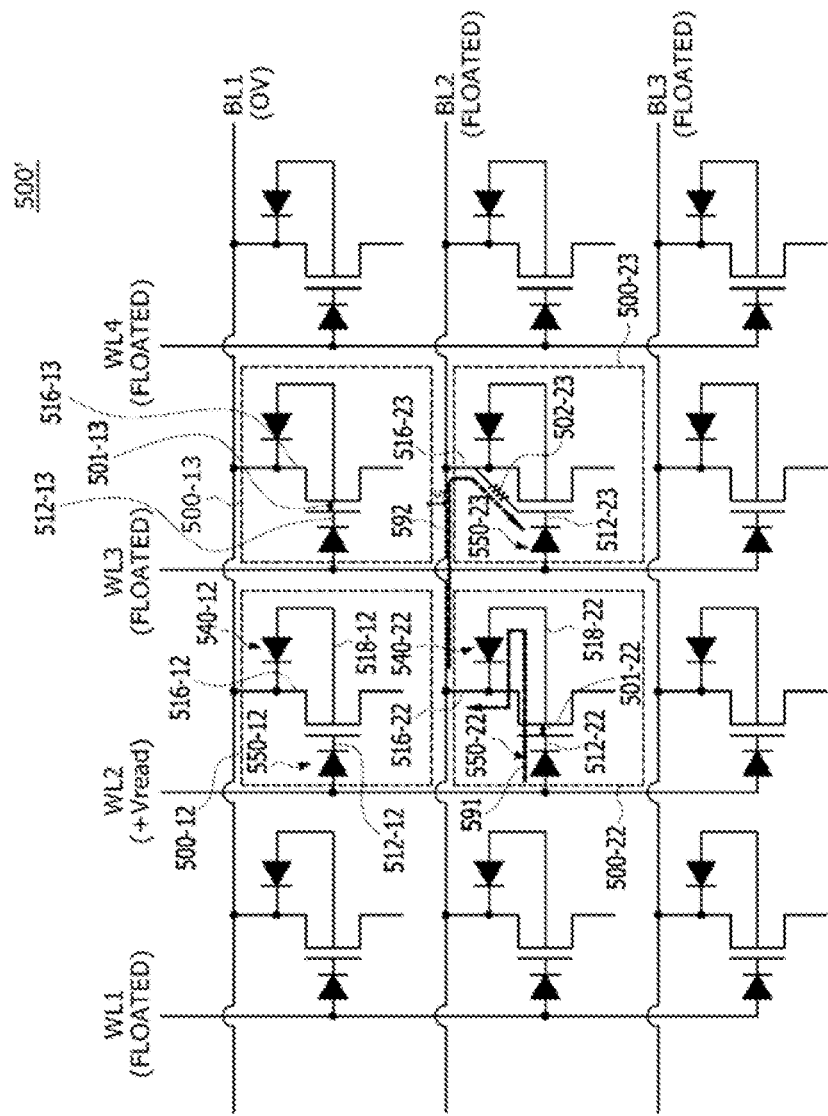
FIG. 14 is an equivalent circuit diagram illustrating a sneak current blocking mechanism during a read operation of the antifuse-type memory cell array shown in FIG. 12.

FIG. 14 is an equivalent circuit diagram illustrating a sneak current blocking mechanism during a read operation of the antifuse-type memory cell array 500' shown in FIG. 12. Referring to FIG. 14, in order to selectively read out a datum stored in an antifuse-type memory cell 500-12 located at a cross point of a first row and a second column, a positive read voltage +Vread may be applied to the second word line WL2 and the first bit line BL1 may be grounded. The remaining word lines WL1, WL3 and WL4 and the remaining bit lines BL2 and BL3 may be floated. Under the above read bias condition, a sense amplifier (not shown) connected to the first bit line BL1 may sense a current flowing through the first bit line BL1 to discriminate program data of the selected antifuse-type memory cell 500-12. If the selected antifuse-type memory cell 500-12 is programmed with the first program data to have a resistive current path between a gate terminal 512-12 and a body terminal 518-12 or between the gate terminal 512-12 and a drain terminal 516-12, a current may flow from the second word line WL2 toward the first bit line BL1 through a bulk PN diode 540-12 coupled between the body terminal 518-12 and the drain terminal 516-12 or without passing through the bulk PN diode 540-12. In contrast, if the selected antifuse-type memory cell 500-12 is programmed with the second program data without any resistive current path between the gate terminal 512-12 and the body terminal 518-12 or between the gate terminal 512-12 and the drain terminal 516-12, no current may flow from the second word line WL2 toward the first bit line BL1.

In the present embodiment, a read operation of the selected antifuse-type memory cell 500-12 programmed with the second program data will be described hereinafter. Accordingly, when the read operation of the selected antifuse-type memory cell 500-12 is executed, no current has to flow through the first bit line BL1 normally. If an abnormal current flows through the first bit line BL1 during the read operation, the abnormal current may cause a malfunction in which the selected antifuse-type memory cell 500-12 is regarded as being programmed with the first program data other than the second program data. For example, the read operation of the selected antifuse-type memory cell 500-12 may be executed when non-selected antifuse-type memory cells 500-22 and 500-13, respectively sharing the second word line WL2 and the first bit line BL1 with the selected antifuse-type memory cells 500-12 as well as a non-selected antifuse-type memory cell 500-23 sharing the second bit line BL2 with the non-selected antifuse-type memory cell 500-22 and sharing the third word line WL3 with the non-selected antifuse-type memory cell 500-13 are programmed with the first program data to have resistive current paths. Particularly, the non-selected antifuse-type memory cell 500-23 is programmed to have a resistive current path 502-23 which is formed between a gate terminal 512-23 and a drain terminal 516-23 to provide an electrical short circuit therebetween, as described with reference to FIGS. 7 and 8. In such case, a resistive current path of the non-selected antifuse-type memory cell 500-22 (or 500-13) may be formed either between a gate terminal 512-22 (or 512-13) and a drain terminal 516-22 (or 516-13) or between the gate terminal 512-22 (or 512-13) and a body terminal 518-22 (or 518-13). However, it will be described as an example that a resistive current path 501-22 (or 501-13) of the non-selected antifuse-type memory cell 500-22 (or 500-13) is formed between the gate terminal 512-22 (or 512-13) and the body terminal 518-22 (or 518-13).

Under the above read bias condition, a path of sneak current Is may be provided from the second word line WL2 toward the second bit line BL2 through a gate PN diode 550-22, the gate terminal 512-22, the resistive current path 501-22, the body terminal 518-22, a bulk PN diode 540-22 and the drain terminal 516-22 of the non-selected antifuse-type memory cell 500-22, as indicated by an arrow 591. The path of the sneak current Is may be additionally provided from the second bit line BL2 toward the third word line WL3 through the drain terminal 516-23, the resistive current path 502-23 and the gate terminal 512-23 of the non-selected antifuse-type memory cell 500-23, as indicated by an arrow 592. However, this path of the sneak current Is may not reach the third word line WL3 because of the presence of a gate PN diode 550-23 of the non-selected antifuse-type memory cell 500-23. Thus, the sneak current Is cannot flow through the first bit line BL1 regardless of whether the non-selected antifuse-type memory cell 500-13 is a programmed cell. Accordingly, the gate PN diode 550-23 may suppress generation of the sneak current Is to enable the read operation of the selected antifuse-type memory cells 500-12 to be successfully executed without any errors.

Figure 15:
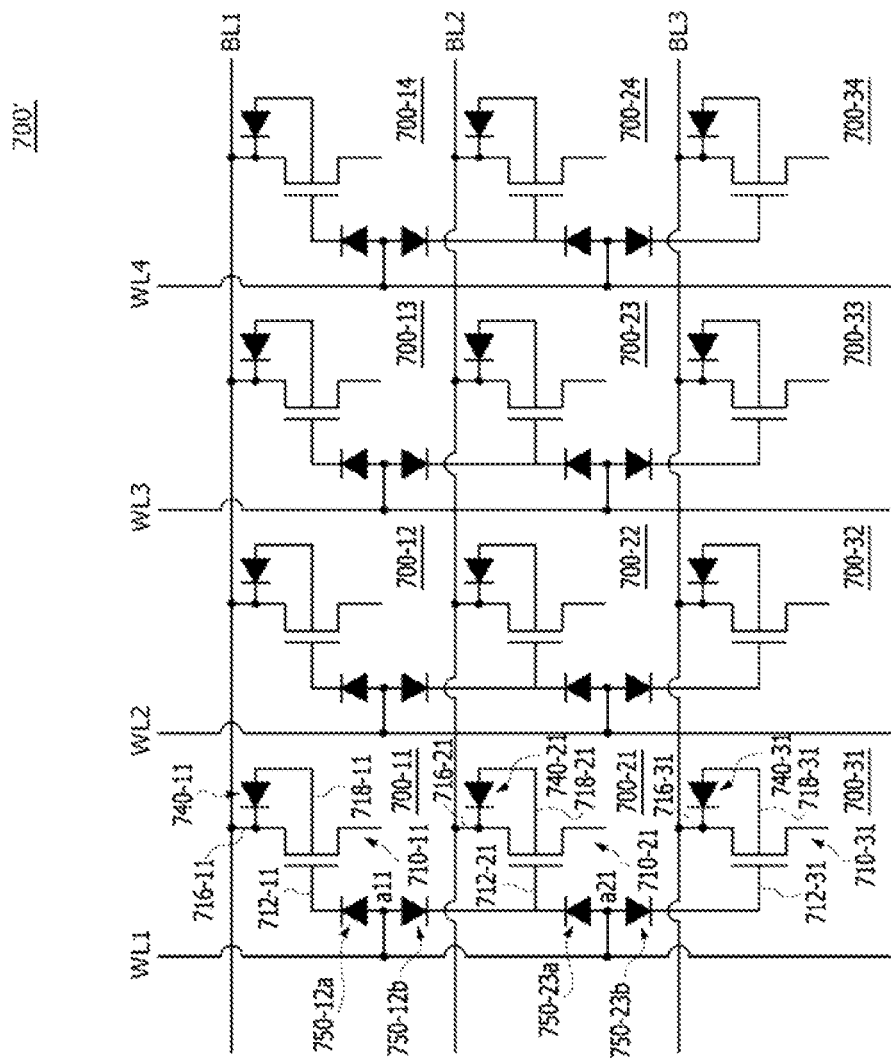
FIG. 15 is an equivalent circuit diagram illustrating an antifuse-type memory cell array according to another embodiment.

FIG. 15 is an equivalent circuit diagram illustrating an antifuse-type memory cell array 700' according to another embodiment. Referring to FIG. 15, the antifuse-type memory cell array 700' may include a plurality of word lines (e.g., first to fourth word lines WL1~WL4) extending in one direction (e.g., a vertical direction in the drawing) and a plurality of bit lines (e.g., first to third bit lines BL1~BL3) extending in another direction (e.g. a horizontal direction in the drawing) intersecting the one direction. Each of the first to fourth word lines WL1~WL4 may be disposed in columns, and each of the first to third bit lines BL1~BL3 may be disposed in rows. The rows and the columns are interchangeable. Thus, columns (or rows) in some embodiments could be termed rows (or columns) in other embodiments without departing from the teachings of the present disclosure. For example, even though word lines are respectively disposed in rows in some embodiments, the word lines may be respectively disposed in columns in other embodiments. Moreover, the number of the word lines and the number of bit lines disposed in the antifuse-type memory cell array 700' may differ. A plurality of antifuse-type memory cells 700-11~700-14, 700-21~700-24, and 700-31~700-34 may be located at cross points of the word lines WL1~WL4 and the bit lines BL1~BL3, respectively.

Each of the plurality of antifuse-type memory cells 700-11~700-14, 700-21~700-24, and 700-31~700-34 may have the same configuration as described with reference to FIG. 1. For example, the antifuse-type memory cell 700-11 located at a cross point of the first word line WL1 (i.e., a first column) and the first bit line BL1 (i.e., a first row) may include an antifuse element 710-11 and a gate PN diode 750-12a. The antifuse element 710-11 may have a gate terminal 712-11, a drain terminal 716-11 and a body terminal 718-11. The body terminal 718-11 may be coupled to the drain terminal 716-11 through a bulk PN diode 740-11. An anode and a cathode of the bulk PN diode 740-11 may be coupled to the body terminal 718-11 and the drain terminal 716-11, respectively. The drain terminal 716-11 may be coupled to the first bit line BL1. The gate PN diode 750-12a may be coupled between the gate terminal 712-11 and a first node a11. The first node a11 may be a node branched from the first word line WL1. The gate PN diode 750-12a may have an anode coupled to the first node a11 and a cathode coupled to the gate terminal 712-11. Each of the antifuse-type memory cells 700-12, 700-13 and 700-14 sharing the first bit line BL1 with the antifuse-type memory cell 700-11 may have the same configuration as the antifuse-type memory cell 700-11.

The antifuse-type memory cell 700-21 located at a cross point of the first word line WL1 (i.e., a first column) and the second bit line BL2 (i.e., a second row) may include an antifuse element 710-21 and gate PN diodes 750-12b and 750-23a. The antifuse element 710-21 may have a gate terminal 712-21, a drain terminal 716-21 and a body terminal 718-21. The body terminal 718-21 may be coupled to the drain terminal 716-21 through a bulk PN diode 740-21. An anode and a cathode of the bulk PN diode 740-21 may be coupled to the body terminal 718-21 and the drain terminal 716-21, respectively. The drain terminal 716-21 may be coupled to the second bit line BL2. The gate PN diode 750-12b may be coupled between the gate terminal 712-21 and the first node a11, and the gate PN diode 750-23a may be coupled between the gate terminal 712-21 and a second node a21. The second node a21 may be a node branched from the first word line WL1, like the first node a11. The gate PN diode 750-12b may have an anode coupled to the first node a11 and a cathode coupled to the gate terminal 712-21. The gate PN diode 750-23a may have an anode coupled to the second node a21 and a cathode coupled to the gate terminal 712-21. Each of the antifuse-type memory cells 700-22, 700-23 and 700-24 sharing the second bit line BL2 with the antifuse-type memory cell 700-21 may have the same configuration as the antifuse-type memory cell 700-21.

The antifuse-type memory cell 700-31 located at a cross point of the first word line WL1 (i.e., a first column) and the third bit line BL3 (i.e., a third row) may include an antifuse element 710-31 and a gate PN diode 750-23b. The antifuse element 710-31 may have a gate terminal 712-31, a drain terminal 716-31 and a body terminal 718-31. The body terminal 718-31 may be coupled to the drain terminal 716-31 through a bulk PN diode 740-31. An anode and a cathode of the bulk PN diode 740-31 may be coupled to the body terminal 718-31 and the drain terminal 716-31 respectively. The drain terminal 716-31 may be coupled to the third bit line BL3. The gate PN diode 750-23b may be coupled between the gate terminal 712-31 and the second node a21. The gate PN diode 750-23b may have an anode coupled to the second node a21 and a cathode coupled to the gate terminal 712-31. Each of the antifuse-type memory cells 700-32, 700-33 and 700-34 sharing the third bit line BL3 with the antifuse-type memory cell 700-31 may have the same configuration as the antifuse-type memory cell 700-31.

In order to selectively program the antifuse-type memory cell 700-11 with the first program data, a positive program voltage may be applied to the first word line WL1 connected to the selected antifuse-type memory cell 700-11 and the first bit line BL1 connected to the selected antifuse-type memory cell 700-11 may be grounded. The remaining word lines WL2~WL4 and the remaining bit lines BL2 and BL3 may be floated. As a result of the program operation of the antifuse-type memory cell 700-11, a resistive current path may be formed between the gate terminal 712-11 and the body terminal 718-11 or between the gate terminal 712-11 and the drain terminal 716-11 as described with reference to FIGS. 5 to 8. Non-selected antifuse-type memory cells 700-12, 700-13 and 700-14, which are arrayed in a first row to share the first bit line BL1 with the selected antifuse-type memory cell 700-11, may not be programmed because the second to fourth word lines WL2~WL4 are floated. Non-selected antifuse-type memory cells 700-21 and 700-31, which are arrayed in a first column to share the first word line WL1 with the selected antifuse-type memory cell 700-11, may not be programmed because the second and third bit lines BL2 and BL3 are floated. Non-selected antifuse-type memory cells 700-22 to 700-24 and 700-32 to 700-34, which are located at cross points of second to fourth columns and second and third rows not to share any word lines or any bit lines with the selected antifuse-type memory cell 700-11, may not be programmed because all of the second to fourth word lines WL2~WL4 and the second and third bit lines BL2 and BL3 are floated.

In order to read out a datum stored in the selected antifuse-type memory cell 700-11, a positive read voltage may be applied to the first word line WL1 connected to the selected antifuse-type memory cell 700-11 and the first bit line BL1 connected to the selected antifuse-type memory cell 700-11 may be grounded. The remaining word lines WL2~WL4 and the remaining bit lines BL2 and BL3 may be floated. If the selected antifuse-type memory cell 700-11 is programmed with the first program data, a resistive current path is formed between the gate terminal 712-11 and the body terminal 718-11 or between the gate terminal 712-11 and the drain terminal 716-11. A current may flow from the first word line WL1 toward the first bit line BL1 through the resistive current path under the above read bias condition. Thus, the selected antifuse-type memory cell 700-11 may be programmed with the first program data by sensing a current that flows through the first bit line BL1. If the selected antifuse-type memory cell 700-11 is programmed with the second program data, a resistive current path is not formed between the gate terminal 512-11 and the body terminal 518-11 and between the gate terminal 512-11 and the drain terminal 516-11. No current flows from the first word line WL1 toward the first bit line BL1 under the above read bias condition. Since the second to fourth word lines WL2~WL4 connected to other antifuse-type memory cells 700-12, 700-13, and 700-14 (i.e. non-selected antifuse-type memory cells) which are arrayed in a first row to share the first bit line BL1 with the selected antifuse-type memory cell 700-11 are floated, no parasitic current may flow from the second to fourth word lines WL2~WL4 toward the first bit line BL1. Thus, a read operation of the selected antifuse-type memory cell 700-11 may not be affected by the non-selected antifuse-type memory cells 700-12, 700-13, and 700-14 sharing the first bit line BL1 with the selected antifuse-type memory cell 700-11 regardless of whether the non-selected antifuse-type memory cells 700-12, 700-13, and 700-14 have a programmed state or not.

Figure 16:
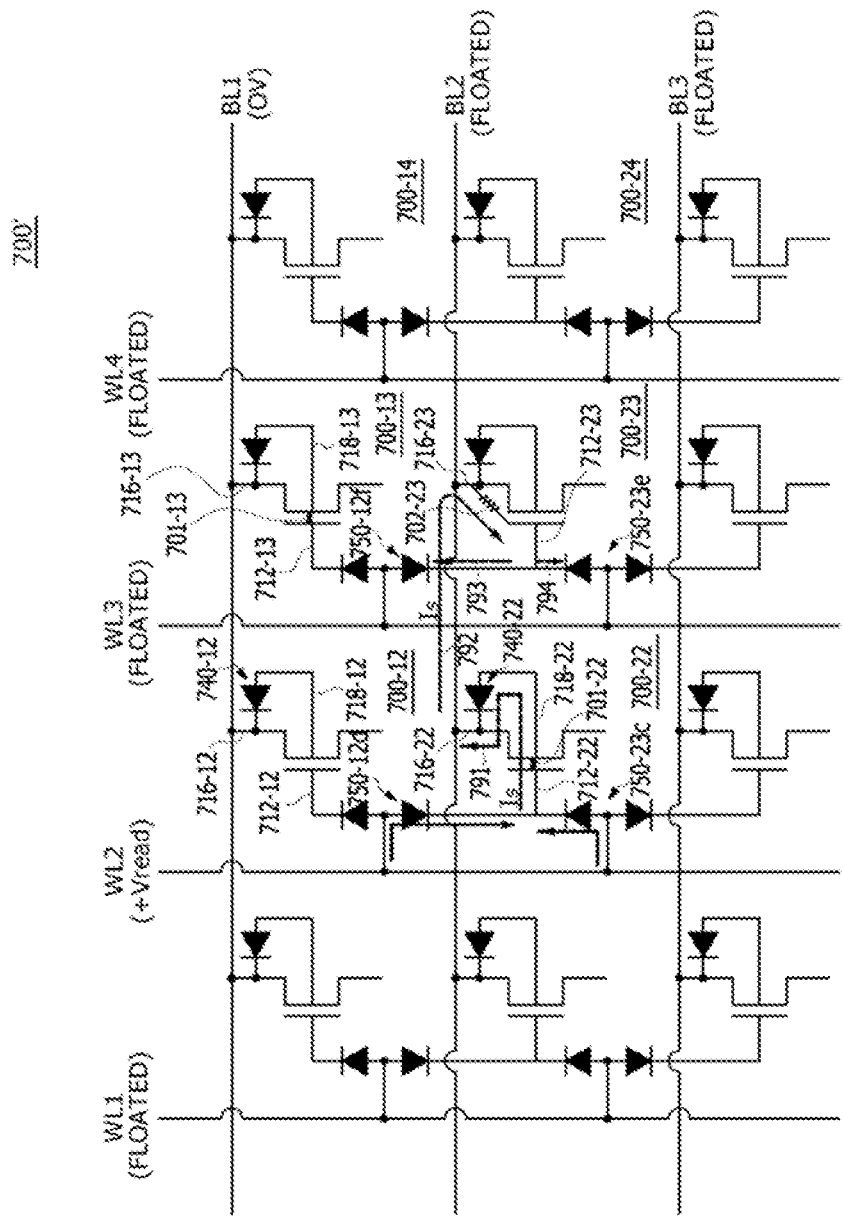
FIG. 16 is an equivalent circuit diagram illustrating a sneak current blocking mechanism during a read operation of the antifuse-type memory cell array shown in FIG. 15.

FIG. 16 is an equivalent circuit diagram illustrating a sneak current blocking mechanism during a read operation of the antifuse-type memory cell array 700' shown in FIG. 15. Referring to FIG. 16, irk order to selectively read out a datum stored in the antifuse-type memory cell 700-12 located at a cross point of a first row and a second column, a positive read voltage +Vread may be applied to the second word line WL2 and the first bit line BL1 may be grounded. The remaining word lines WL1, WL3 and WL4 and the remaining bit lines BL2 and BL3 may be floated. Under the above read bias condition, a sense amplifier (not shown) connected to the first bit line BL1 may sense a current flowing through the first bit line BL1 to discriminate program data of the selected antifuse-type memory cell 700-12. If the selected antifuse-type memory cell 700-12 is programmed with the first program data to have a resistive current path between a gate terminal 712-12 and a body terminal 718-12 or between the gate terminal 712-12 and a drain terminal 716-12, a current may flow from the second word line WL2 toward the first bit line BL1 through a bulk PN diode 740-12 coupled between the body terminal 718-12 and the drain terminal 716-12 or without passing through the bulk PN diode 740-12. In contrast, if the selected antifuse-type memory cell 700-12 is programmed with the second program data without any resistive current path between the gate terminal 712-12 and the body terminal 718-12 or between the gate terminal 712-12 and the drain terminal 716-12, no current may flow from the second word line WL2 toward the first bit line BL1.

In the present embodiment, a read operation of the selected antifuse-type memory cell 700-12 programmed with the second program data will be described hereinafter. Accordingly, when the read operation of the selected antifuse-type memory cell 700-12 is executed, no current has to flow through the first bit line BL1 normally. If an abnormal current flows through the first bit line BL1 during the read operation, the abnormal current may cause a malfunction in which the selected antifuse-type memory cell 700-12 is regarded as being programmed with the first program data other than the second program data. For example, the read operation of the selected antifuse-type memory cell 700-12 may be executed when non-selected antifuse-type memory cells 700-22 and 700-13 respectively sharing the second word line WL2 and the first bit line BL1 with the selected antifuse-type memory cells 700-12 as well as a non-selected antifuse-type memory cell 700-23 sharing the second bit line BL2 with the non-selected antifuse-type memory cell 700-22 and sharing the third word line WL3 with the non-selected antifuse-type memory cell 700-13 are programmed with the first program data to have resistive current paths. Particularly, the non-selected antifuse-type memory cell 700-23 is programmed to have a resistive current path 702-23 which is formed between a gate terminal 712-23 and a drain terminal 716-23 to provide an electrical short circuit therebetween, as described with reference to FIGS. 7 and 8. In such case, a resistive current path of the non-selected antifuse-type memory cell 700-22 (or 700-13) may be formed either between a gate terminal 712-22 (or 712-13) and a drain terminal 716-22 (or 716-13) or between the gate terminal 712-22 (or 712-13) and a body terminal 718-22 (or 718-13). However, it will be described as an example that a resistive current path 701-22 (or 701-13) of the non-selected antifuse-type memory cell 700-22 (or 700-13) is formed between the gate terminal 712-22 (or 712-13) and the body terminal 718-22 (or 718-13).

Under the above read bias condition, a path of a sneak current Is may be provided from the second word line WL2 toward the second bit line BL2 through gate PN diodes 750-12*d* and 750-23*c*, the gate terminal 712-22, the resistive current path 701-22, the body terminal 718-22, a bulk PN diode 740-22 and the drain terminal 716-22 of the non-selected antifuse-type memory cell 700-22, as indicated by an arrow 791. The path of the sneak current Is may be additionally provided from the second bit line BL2 toward the third word line WL3 through the drain terminal 716-23 the resistive current path 702-23 and the gate terminal 712-23 of the non-selected antifuse-type memory cell 700-23, as indicated by an arrow 792. However, this path of the sneak current Is may not reach the third word line WL3 because of the presence of gate PN diodes 750-12*f* and 750-23*e* of the non-selected antifuse-type memory cell 700-23. Thus, the sneak current Is cannot flow through the first bit line BL1 regardless of whether the non-selected antifuse-type memory cell 700-13 is a programmed cell. Accordingly, the gate PN diodes 750-12*f* and 750-23*e* may suppress generation of the sneak current Is to enable the read operation of the selected antifuse-type memory cells 700-12 to be successfully executed without any errors.

Figure 17:
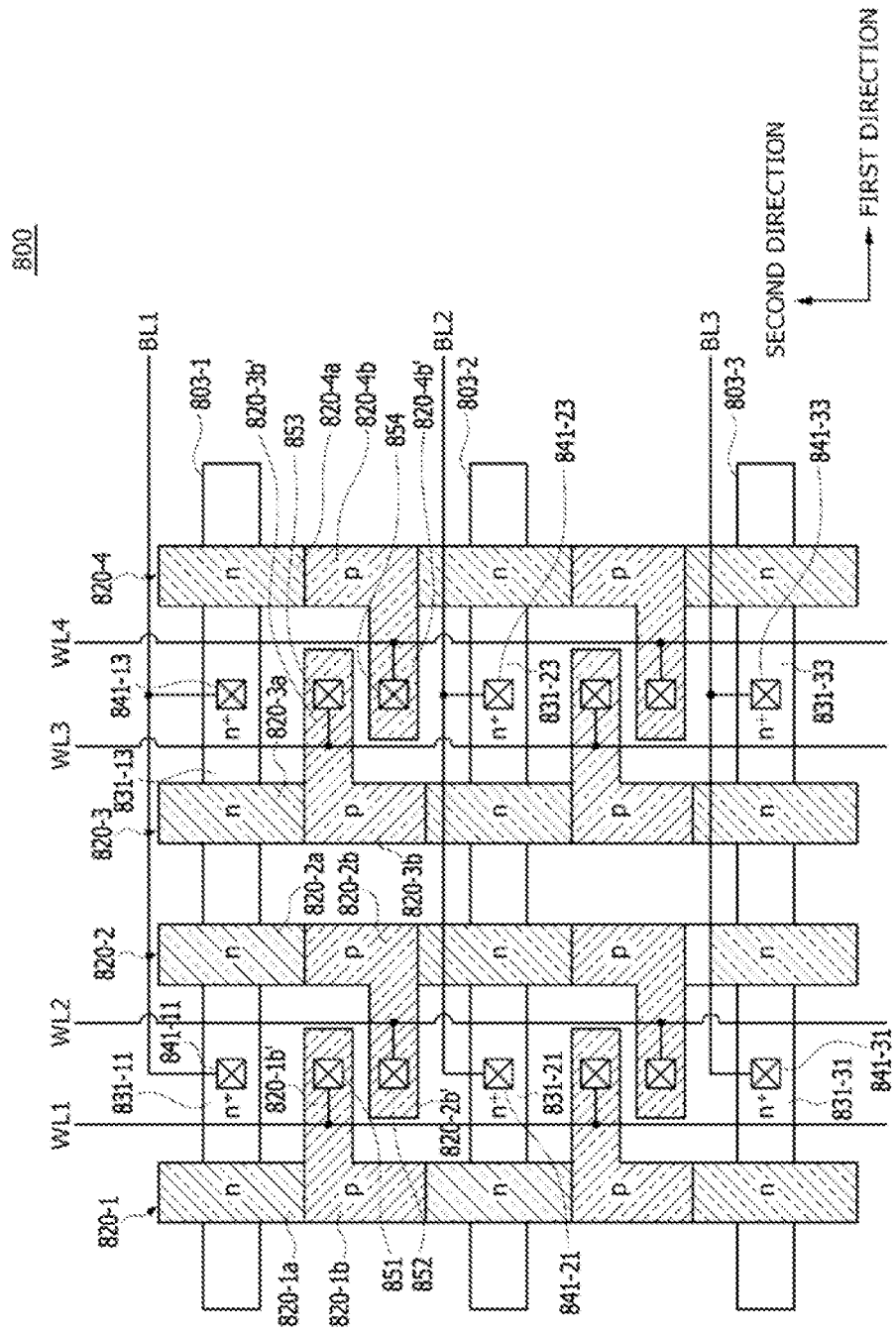
FIG. 17 is a layout diagram for realizing the antifuse-type memory cell array shown in FIG. 15.

FIG. 17 is a layout diagram for realizing the antifuse-type memory cell array 700' shown in FIG. 15. Referring to FIG. 17, an antifuse-type memory cell layout 800 may include a plurality of active regions, for example, first to third active regions 803-1, 803-2 and 803-3 extending in a first direction. The first to third active regions 803-1, 803-2 and 803-3 may be arrayed in a second direction intersecting the first direction to be spaced apart from each other. The first to third active regions 803-1, 803-2 and 803-3 may be disposed in first to third rows of the antifuse-type memory cell layout 800, respectively. A plurality of gate lines, for example, first to fourth gate lines 820-1, 820-2, 820-3 and 820-4 may be disposed to extend in the second direction. The first to fourth gate lines 820-1, 820-2, 820-3 and 820-4 may be arrayed in the first direction to be spaced apart from each other. Accordingly, the first to fourth gate lines 820-1, 820-2, 820-3 and 820-4 may intersect the first to third active regions 803-1, 803-2 and 803-3 to provide cross points at which a plurality of antifuse-type memory cells are located. The first to fourth gate lines 820-1, 820-2, 820-3 and 820-4 may be disposed in first to fourth columns of the antifuse-type memory cell layout 800, respectively.

When "N" is an odd number, N-type impurity junction regions may be disposed in the active regions between a gate line disposed in an $N^{th}$ column and a gate line disposed in an $(N+1)^{th}$ column. That is, N-type impurity junction regions 831-11, 831-21 and 831-31 may be respectively disposed in the active regions 803-1, 803-2 and 803-3 between the first gate line 820-1 disposed in a first column and the second gate line 820-2 disposed in a second column, and N-type impurity junction regions 831-13, 831-23 and 831-33 may be respectively disposed in the active regions 803-1, 803-2 and 803-3 between the third gate line 820-3 disposed in a third column and the fourth gate line 820-4 disposed in a fourth column. Bit line contacts 841-11 and 841-13 may be respectively disposed on the N-type impurity junction regions 831-11 and 831-13 in the first active region 803-1, and the bit line contacts 841-11 and 841-13 may be connected to a first bit line BL1. Bit line contacts 841-21 and 841-23 may be respectively disposed on the N-type impurity junction regions 831-21 and 831-23 in the second active region 803-2, and the bit line contacts 841-21 and 841-23 may be connected to a second bit line BL2. Similarly, bit line contacts 841-31 and 841-33 may be respectively disposed on the N-type impurity junction regions 831-31 and 831-33 in the third active region 803-3, and the bit line contacts 841-31 and 841-33 may be connected to a third bit line BL3.

The first gate line 820-1 disposed in a first column may include first gates 820-1a having N-type conductivity and second gates 820-1b having P-type conductivity which are alternately arrayed in a column direction. The second gate line 820-2 disposed in a second column may include first gates 820-2a having N-type conductivity and second gates 820-2b having P-type conductivity which are alternately arrayed in the column direction. The third gate line 820-3 disposed in a third column may include first gates 820-3a having N-type conductivity and second gates 820-3b having P-type conductivity which are alternately arrayed in the column direction. The fourth gate line 820-4 disposed in a fourth column may include first gates 820-4a having N-type conductivity and second gates 820-4b having P-type conductivity which are alternately arrayed in the column direction. In some embodiments, each of the first gates 820-1a, 820-2a, 820-3a and 820-4a may include a polysilicon layer doped with N-type impurities, and each of the second gates 820-1b, 820-2b, 820-3b and 820-4b may include a polysilicon layer doped with P-type impurities.

The first gates 820-1a, 820-2a, 820-3a and 820-4a arrayed in the first row may overlap with the first active region 803-1. The first gates 820-1a, 820-2a, 820-3a and 820-4a arrayed in the second row may overlap with the second active region 803-2. The first gates 820-1a, 820-2a, 820-3a and 820-4a arrayed in the third row may overlap with the third active region 803-3. None of the second gates 820-1b, 820-2b, 820-3b and 820-4b overlap with the active regions 803-1, 803-2 and 803-3.

Each of the second gates 820-1b of the first gate line 820-1 disposed in the first column may have an extension 820-1b' extending toward the second gate line 820-2 disposed in the second column, and a word line contact 851 may be disposed on the extension 820-1W. Word line contacts 851 disposed on extensions 820-1b' may be connected to a first word line WL1. Each of the second gates 820-2b of the second gate line 820-2 disposed in the second column may have an extension 820-2b' extending toward the first gate line 820-1 disposed in the first column, and a word line contact 852 may be disposed on the extension 820-2b'. Word line contacts 852 disposed on extensions 820-2b' may be connected to a second word line WL2. Each of the second gates 820-3b of the third gate line 820-3 disposed in the third column may have an extension 820-3b' extending toward the fourth gate line 820-4 disposed in the fourth column, and a word line contact 853 may be disposed on the extension 820-3b'. Word line contacts 853 disposed on extensions 820-3b' may be connected to a third word line WL3. Each of the second gates 820-4b of the fourth gate line 820-4 disposed in the fourth column may have an extension 820-4b' extending toward the third gate line 820-3 disposed in the third column, and a word line contact 854 may be disposed on the extension 820-4b'. Word line contacts 854 disposed on extensions 820-4b' may be connected to a fourth word line WL4.

Figure 18:
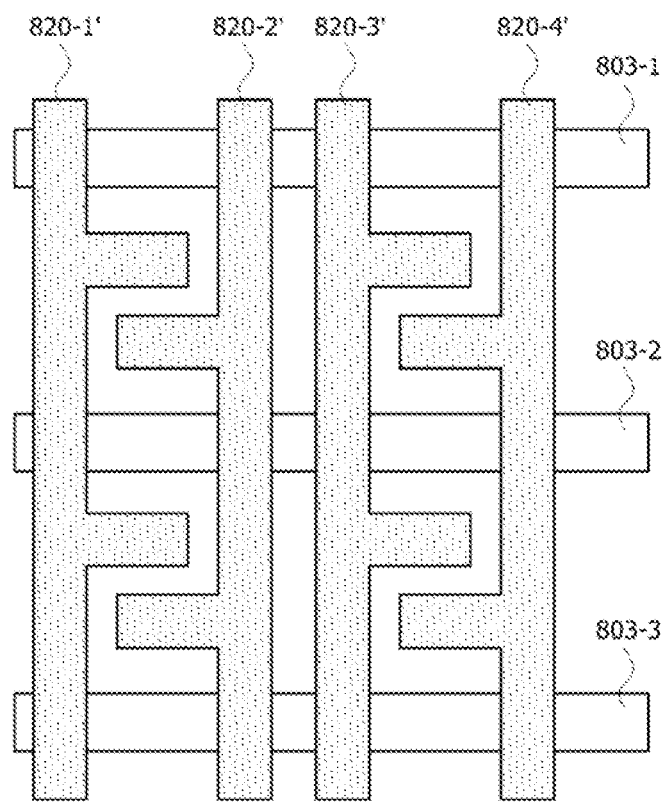
FIGS. 18, 19, 20 and 21 are layout diagrams illustrating a method of fabricating the antifuse-type memory cell array shown in FIG. 17.

FIGS. 18, 19, 20 and 21 are layout diagrams illustrating a method of fabricating the antifuse-type memory cell layout 800 shown in FIG. 17. Referring to FIG. 18, a plurality of active regions, for example, first to third active regions 803-1, 803-2 and 803-3 may be formed in a substrate (not shown). The first to third active regions 803-1, 803-2 and 803-3 may be defined by forming a trench isolation layer in the substrate. First to fourth semiconductor patterns 820-1', 820-2', 820-3' and 820-4' may be formed to intersect the first to third active regions 803-1, 803-2 and 803-3. Each of the first to fourth semiconductor patterns 820-1', 820-2', 820-3' and 820-4' may partially overlap with the first to third active regions 803-1, 803-2 and 803-3. Although not shown in FIG. 18, an insulation layer may be disposed between the first to fourth semiconductor patterns 820-1', 820-2', 820-3' and 820-4' and the first to third active regions 803-1, 803-2 and 803-3. Each of the first to fourth semiconductor patterns 820-1', 820-2', 820-3' and 820-4' may be formed to have extensions which are located between the active regions 803-1, 803-2 and 803-3.

Figure 19:
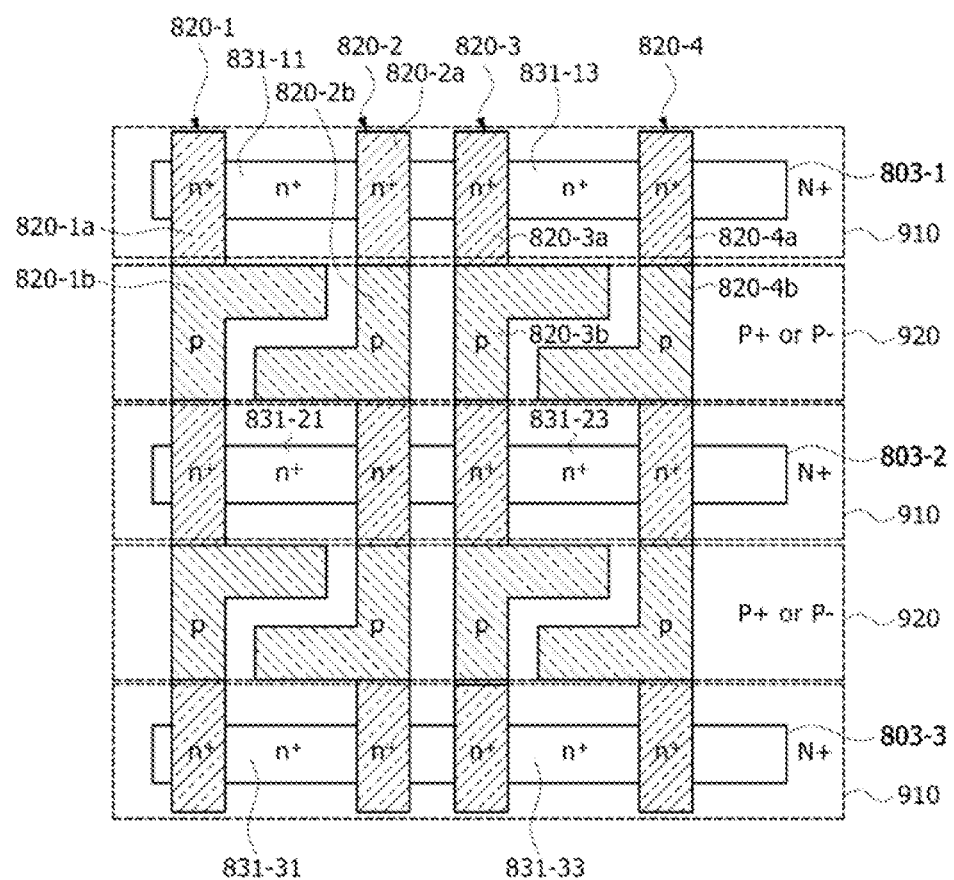

Referring to FIG. 19, a first mask (not shown) having first openings 910 may be formed on the substrate including the first to fourth semiconductor patterns 820-1', 820-2', 820-3' and 820-4' so that the first openings 910 expose the first to third active regions 803-1, 803-2 and 803-3 and expose portions of the first to fourth semiconductor patterns 820-1', 820-2', 820-3' and 820-4' overlapping with the active regions 803-1, 803-2 and 803-3. Subsequently, N-type impurity ions may be implanted into the first to third active regions 803-1, 803-2 and 803-3 and the first to fourth semiconductor patterns 820-1', 820-2', 820-3' and 820-4' which are exposed by the first openings 910. As a result, N-type impurity junction regions may be formed in the first to third active regions 803-1, 803-2 and 803-3 between the first and second semiconductor patterns 820-1' and 820-2' and between the third and fourth semiconductor patterns 820-3' and 820-4'. For example, N-type impurity junction regions 831-11 and 831-13 may be formed in the first active region 803-1 between the first and second semiconductor patterns 820-1' and 820-2' and the first active region 803-1 between the third and fourth semiconductor patterns 820-3' and 820-4' respectively, and N-type impurity junction regions 831-21 and 831-23 may be formed in the second active region 803-2 between the first and second semiconductor patterns 820-1' and 820-2' and the second active region 803-2 between the third and fourth semiconductor patterns 820-3' and 820-4' respectively. Moreover, N-type impurity junction regions 831-31 and 831-33 may be formed in the third active region 803-3 between the first and second semiconductor patterns 820-1' and 820-2' and the third active region 803-3 between the third and fourth semiconductor patterns 820-3' and 820-4' respectively. In addition, portions of the first semiconductor pattern 820-1' overlapping with the active regions 803-1, 803-2 and 803-3 may be doped with the N-type impurity ions to form first gates 820-1a, and portions of the second semiconductor pattern 820-2' overlapping with the active regions 803-1, 803-2 and 803-3 may be doped with the N-type impurity ions to form first gates 820-2a. Similarly, portions of the third semiconductor pattern 820-3' overlapping with the active regions 803-1, 803-2 and 803-3 may be doped with the N-type impurity ions to form first gates 820-3a, and portions of the fourth semiconductor pattern 820-4' overlapping with the active regions 803-1, 803-2 and 803-3 may be doped with the N-type impurity ions to form first gates 820-4a.

A second mask (not shown) having second openings 920 may be formed on the substrate including the first to fourth semiconductor patterns 820-1', 820-2', 820-3' and 820-4' so that the second openings 920 expose portions of the first to fourth semiconductor patterns 820-1', 820-2', 820-3' and 820-4' between the active regions 803-1, 803-2 and 803-3. Subsequently, P-type impurity ions may be implanted into the first to fourth semiconductor patterns 820-1', 820-2', 820-3' and 820-4' which are exposed by the second openings 920. As a result, portions of the first semiconductor pattern 820-1' between the first gates 820-1a may be doped with the P-type impurity ions to form second gates 820-1b, and portions of the second semiconductor pattern 820-2' between the first gates 820-2a may be doped with the P-type impurity ions to form second gates 820-2b. Similarly, portions of the third semiconductor pattern 820-3' between the first gates 820-3a may be doped with the P-type impurity ions to form second gates 820-3b, and portions of the fourth semiconductor pattern 820-4' between the first gates 820-4a may be doped with the P-type impurity ions to form second gates 820-4b.

The first gates 820-1a and the second gates 820-1b which are alternately arrayed in the first column may constitute a first gate line 820-1, and the first gates 820-2a and the second gates 820-2b which are alternately arrayed in the second column may constitute a second gate line 820-2. Similarly, the first gates 820-3a and the second gates 820-3b which are alternately arrayed in the third column may constitute a third gate line 820-3, and the first gates 820-4a and the second gates 820-4b which are alternately arrayed in the fourth column may constitute a fourth gate line 820-4.

Figure 20:
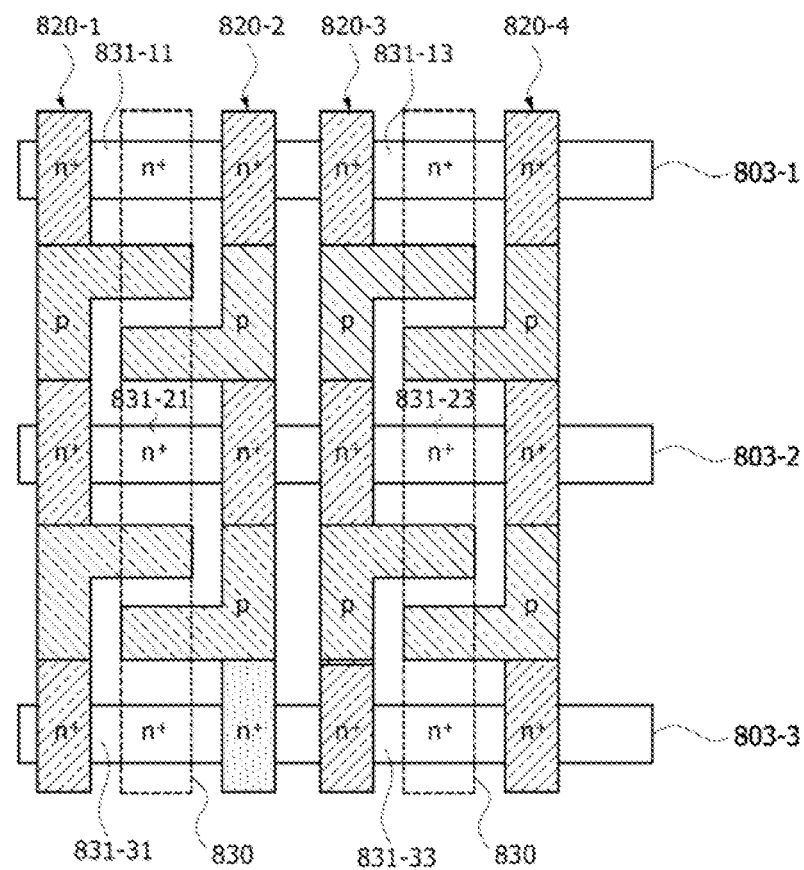

Referring to FIG. 20, a self-aligned silicide (SALICIDE) process may be performed using a third mask having third openings 830 that expose portions of the second gates 820-1b, 820-2b, 820-3b and 820-4b and portions of the N-type impurity junction regions 831-11, 831-13, 831-21, 831-23, 831-31 and 831-33. As a result, a silicide layer (not shown) may be formed on a portion of each of the second gates 820-1b, 820-2b, 820-3b and 820-4b and the N-type impurity junction regions 831-11, 831-13, 831-21, 831-23, 831-31 and 831-33.

Figure 21:
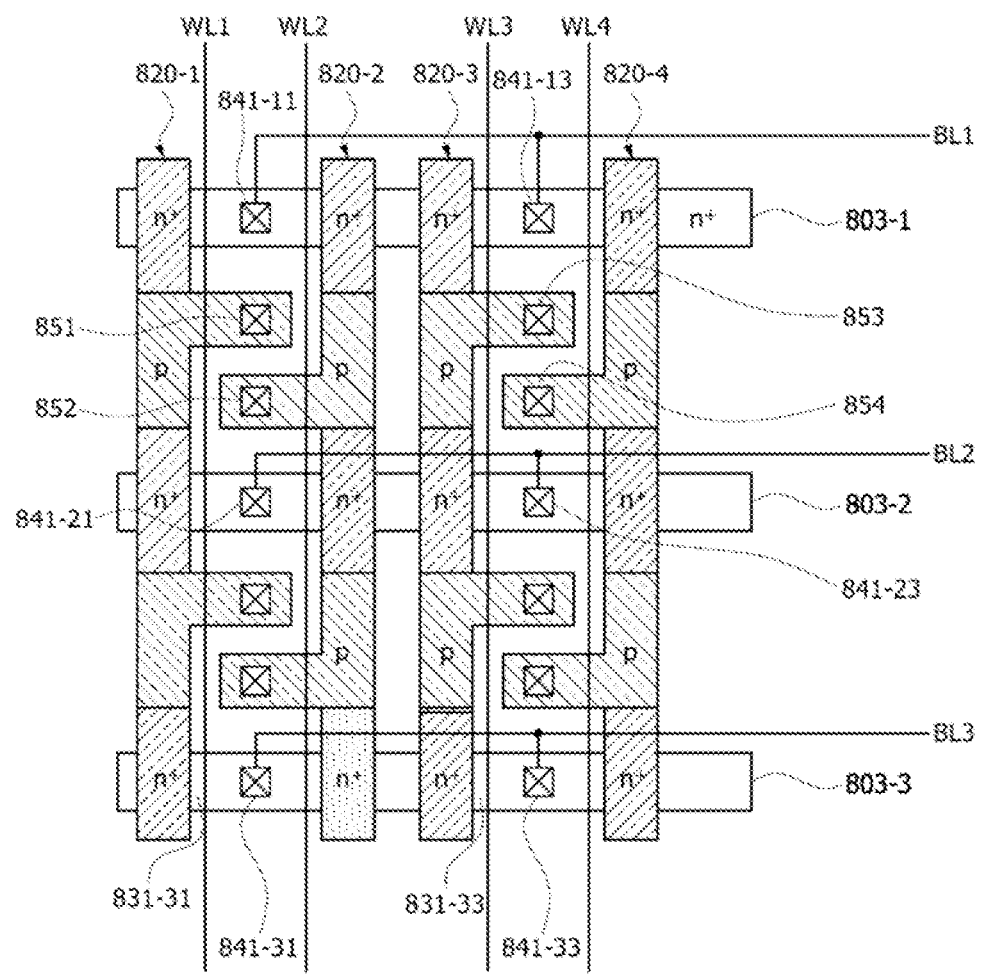

Referring to FIG. 21, bit line contacts 841-11, 841-13, 841-21, 841-23, 841-31 and 841-33 may be formed on the silicide layers which are formed on the N-type impurity junction regions 831-11, 831-13, 831-21, 831-23, 831-31 and 831-33, respectively. Word line contacts 851, 852, 853 and 854 may also be formed on the silicide layers which are formed on the second gates 820-1b, 820-2b, 820-3b and 820-4b, respectively. First to third bit lines BL1, BL2 and BL3 may be formed using an interconnection process so that the bit line contacts 841-11 and 841-13 in the first row, the bit line contacts 841-21 and 841-23 in the second row, and the bit line contacts 841-31 and 841-33 in the third row are electrically connected to the first to third bit lines BL1, BL2 and BL3 respectively. In addition, first to fourth word lines WL1, WL2, WL3 and WL4 may be formed so that the word line contact 851 on the first gate line 820-1, the word line contact 852 on the second gate line 820-2, the word line contact 853 on the third gate line 820-3, and the word line contact 854 on the fourth gate line 820-4 are electrically connected to the first to fourth word lines WL1, WL2, WL3 and WL4, respectively.

According to the embodiments described above, even though rupture of a gate insulation layer of an antifuse element occurs either between a gate terminal and a body or between the gate terminal and a drain terminal during a program operation, a gate PN diode coupled between the gate terminal and a word line may block a sneak current to prevent an erroneous read operation.

The embodiments of the present disclosure have been disclosed above for illustrative purposes. Those of ordinary skill in the art will appreciate that various modifications, additions, and substitutions are possible, without departing from the scope and spirit of the present disclosure as claimed below.

What is claimed is:

1. An antifuse memory cell comprising:
    an active region extending in a first direction, and having a channel region of a first conductivity type, the active region be defined by a trench isolation layer;
    a first impurity junction region of a second conductivity type and the second impurity junction region of the second conductivity type, wherein the first and the second impurity junction regions are separated from each other by the channel region in an upper region of the active region;
    a gate electrode extending in a second direction to intersect the active region, and having a first gate electrode of the second conductivity type that overlaps with the channel region of the active region and a second gate electrode of the first conductivity type that is in contact with the first gate electrode along the second direction without overlapping with the active region;
    an insulation layer between the active region and the gate electrode,
    a first contact plug over the second gate electrode and coupled to a word line; and
    a second contact plug over the second impurity junction region and coupled to a bit line,
    wherein the first impurity junction region is electrically floated.

2. The antifuse memory cell of claim 1, further comprising:
    a first silicide layer between the second gate electrode and the first contact plug; and
    a second silicide layer between the second impurity junction region and the second contact plug.

3. The antifuse memory cell of claim 1, wherein the first conductivity type is P-type and the second conductivity type is N-type.

4. The antifuse memory cell of claim 1, wherein an edge of the second impurity junction region overlaps with an edge of the first gate electrode.

5. The antifuse memory cell of claim 1, further comprising:
    a body of the first conductivity type having the channel region defined in an upper region thereof,
    wherein the insulation layer is on the body, and the second impurity junction region is in an upper region of the body.

* * * * *